United States Patent [19]
Fujita

[11] Patent Number: 5,379,259
[45] Date of Patent: Jan. 3, 1995

[54] SEMICONDUCTOR MEMORY DEVICE

[75] Inventor: Koreaki Fujita, Hyogo, Japan

[73] Assignee: Mitsubishi Denki Kabushiki Kaisha, Tokyo, Japan

[21] Appl. No.: 24,141

[22] Filed: Mar. 1, 1993

[30] Foreign Application Priority Data

Feb. 28, 1992 [JP] Japan .................................. 4-042567

[51] Int. Cl.⁶ .............................................. G11C 7/00
[52] U.S. Cl. ................................. 365/200; 365/225.7; 365/230.03
[58] Field of Search ................. 365/200, 230.03, 225.7

[56] References Cited

U.S. PATENT DOCUMENTS

| | | | |
|---|---|---|---|
| 4,601,019 | 7/1986 | Shah et al. | 365/200 |
| 4,757,474 | 7/1988 | Fukushi et al. | 365/200 |
| 4,807,191 | 2/1989 | Flannagan | 365/200 |
| 4,817,056 | 3/1989 | Furutani et al. | 365/200 |
| 4,837,747 | 6/1989 | Dosaka et al. | 365/200 |
| 5,021,944 | 6/1991 | Sasaki et al. | 365/200 |
| 5,195,057 | 3/1993 | Kasa et al. | 365/200 |

FOREIGN PATENT DOCUMENTS 57-29799  6/1982  Japan .

Primary Examiner—Eugene R. LaRoche
Assistant Examiner—Son Dinh
Attorney, Agent, or Firm—Lowe, Price, LeBlanc & Becker

[57] ABSTRACT

Two redundant blocks RB1 and RB2 are provided independent from the normal memory cell block BL, and selection of the redundant block when redundancy is selected is carried out by a least significant column address signal Y0 and a signal /Y0 complementary thereto in a semiconductor memory device. Therefore, a semiconductor memory device can be provided in which when defective bits exist continuously in a memory cell array, the continuous defective bit can be replaced by two redundant bit lines.

23 Claims, 25 Drawing Sheets

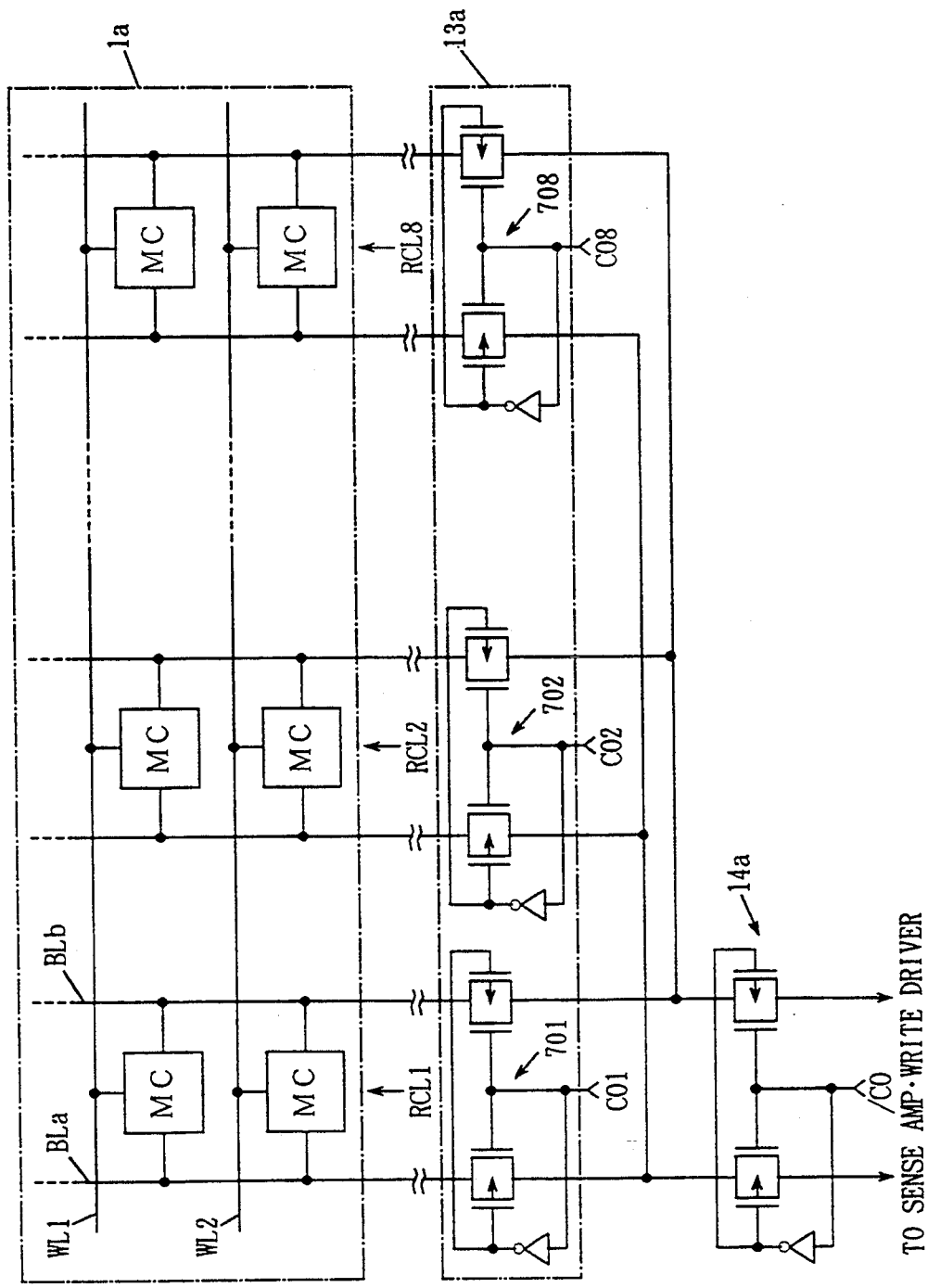

FIG. 2C
(1)
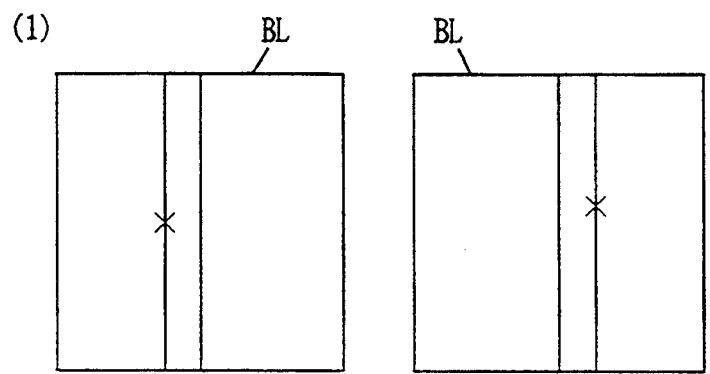
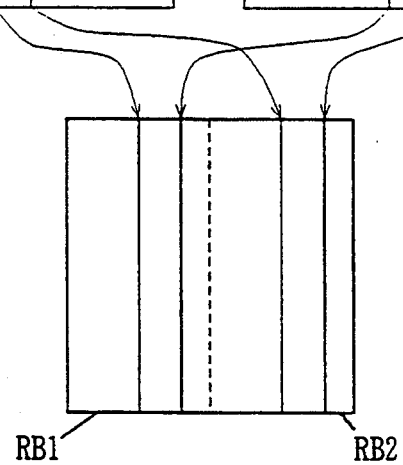
(2)
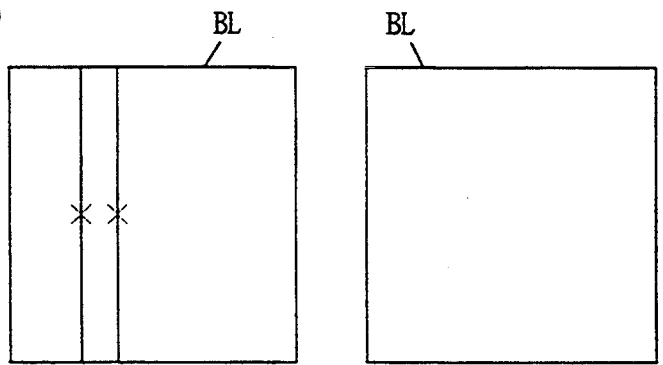
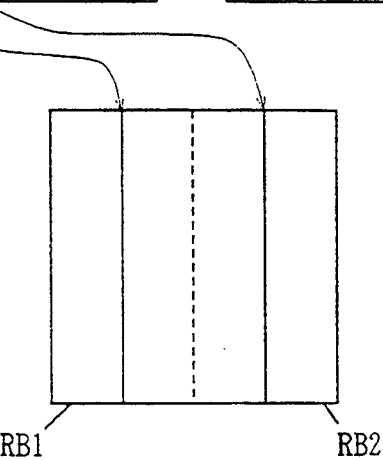

(a)

(b)

SEMICONDUCTOR MEMORY DEVICE

BACKGROUND OF THE INVENTION

1. Field of the Invention

The present invention generally relates to semiconductor memory devices, and, more specifically to a semiconductor memory device including redundant memory cell arrays for repairing defects.

2. Description of the Background Art

Conventionally, semiconductor memory devices such as static random access memories (hereinafter referred to as "SRAMs") include redundancy circuits to improve production yield. If there is a defect in a manufactured semiconductor memory device, the semiconductor memory device is repaired by the function of the redundances circuit. Namely, in the conventional semiconductor memory device, a row or a column including a defective memory cell is functionally replaced by a predetermined spare row or a spare column. The present invention can be generally applied to semiconductor memory devices such as SRAMs and DRAMs. However, in the following description, an example in which this invention is applied to an SRAM will be described.

FIG. 23 is a block diagram of a conventional SRAM having a redundancy circuit. Referring to FIG. 23, the SRAM 100 includes a plurality of memory cell arrays 80 for storing data, a plurality of row decoders 82 responsive to a row address signal X for selecting a word line WL in the memory cell arrays 80, a plurality of column decoders 83 for selecting a column in the memory cell in response to a column address signal Y, a plurality of write driver circuits 84 and a plurality of sense amplifiers 85. The SRAM 100 further includes, as the redundancy circuit, a spare memory cell column 81, an address program circuit 86 for programming a defect address indicating the position of the defect, if any, and a plurality of I/O program circuits 87.

For one memory cell array 80, one row decoder 82, a column decoder 83, a write driver 84, a sense amplifier 85 and an I/O program circuit 87 are provided. In FIG. 23, the block on the left side is the same as the block on the right side except the address program circuit 86, and therefore the block on the left side will be mainly described in the following.

In operation, the row decoder 82 activates one word line WL in the memory cell array 80 in responds to an externally applied row address signal X. The column decoder 83 selects one column to be accessed in response to an externally applied column address signal Y. More specifically, the column decoder 83 selectively turns on a transmission gate TG1 connected to a column to be accessed, and electrically connects the bit line to a write driver circuit 84 or to the sense amplifier circuit 85. Therefore, in writing operation, an externally applied input data Di is written to a selected memory cell selected by the row decoder 82 and the column decoder 83. In reading operation, the data signal read from the memory cell selected by the row decoder 82 and the column decoder 83 is amplified by the sense amplifier 85, and the amplified signal is output as an output data Do.

If it is found that there is some defect in a certain memory column, the defective memory cell column is functionally replaced by the spare memory cell column 81 in the following manner. The defect address indicating the position of the defective memory column is programmed in an address program circuit 86 by selectively cutting a fuse (shown in FIG. 25). The address program circuit 86 includes a coincidence detecting circuit, not shown, and coincidence between an externally applied column address signal Y and the programmed address signal is detected. A coincidence detection signal CO is applied to the I/O program circuit 87.

A fuse in the I/O program circuit 87 (see FIG. 26) has been selectively cut in advance, and therefore the bit line in the spare memory cell column 81 is connected to the write driver circuit 84 and/or the sense amplifier 85 through a transmission gate circuit TG2. Consequently, if the column address signal Y coincides with the programmed address signal, the spare memory cell column 81 is accessed instead of the normal memory cell array 80. At this time, the transmission gate circuit TG1 is off.

Although two memory cell arrays 80 and the peripheral circuits 82, 83, . . . thereof are shown in FIG. 23 for convenience of description, generally a conventional SRAM includes a plurality of memory cell arrays and peripheral circuits thereof. Although one block of memory cell array and the peripheral circuit thereof only are shown in FIG. 23, there are a plurality, for example, 64, of blocks actually.

As is apparent from FIG. 23, one or two spare memory cell columns (or rows) are provided for every memory cell array 80, and therefore in the SRAM having a plurality (for example 64) of memory cell arrays includes 64 or 128 spare memory cell columns (or rows).

FIG. 24 is a block diagram of the address program circuit 86 shown in FIG. 23. The address program circuit 86 includes a plurality of fuse circuits 861 to 863 for programming the defect address, and AND gates 864 to 866 for detecting coincidence between the input address signal and the defect address. The fuse circuits 861 to 863 receive corresponding two of the plurality of bits of a column address signal. The number of the fuse circuits and the number of AND gates are changed corresponding to the number of bits of the address signal.

FIG. 25 is a schematic diagram showing the structure of the fuse circuit 861 shown in FIG. 24. The fuse circuit 861 shown in FIG. 25 includes AND gates 111 to 114 for pre-decoding column address signals Y0 and Y1 and fuses 115 and 116 for programming. By selectively cutting the two fuses 115 and/or 116, 2 bits of defect address signal can be programmed. When the fuses 115 and 116 are connected, the inverters 117 and 118 output voltages at high level, respectively. If the fuses 115 and 116 are cut, inverters 117 and 118 output voltages at low level. The AND gate 111 outputs a voltage at high level when column address signals Y0 and Y1 at high level are applied. The AND gate 112 outputs a voltage at a high level when a signal Y0 at high level and a signal Y1 at low level are applied.

The AND gate 113 outputs a high level voltage when the signal Y0 at the low level and the signal Y1 at the high level are applied. The AND gate 114 outputs a high level voltage when the signals Y0 and Y1 at low level are applied.

Therefore, when the fuses 115 and 116 are connected, for example, transmission gates 119 and 120 are turned on. In this case, when the column address signals Y0 and Y1 both at the high level are applied, the AND gate 111 outputs a signal $C_{01}$ at the high level through the transmission gate 119 and 120. In other words, only when 2 bits of defect address programmed by "connection" of the fuses 115 and 116 coincide with the column addresses Y0 at the high level and Y1 at the high level, the fuse circuit 861 outputs the signal $C_{01}$ at the high level. The signal $C_{01}$ is applied to the AND gate 864 shown in FIG. 24.

As a result, the address program circuit 86 shown in FIG. 24 outputs an address coincidence detection signal COi at the high level only when the programmed defect address coincides with the externally applied column address.

FIG. 26 is a schematic diagram of the I/O program circuit 87 shown in FIG. 23. The I/O program circuit 87 shown in FIG. 26 includes a fuse circuit 136 which controls the transmission gate TG2 for input in advance, a transfer gate 137 connected between an input terminal 139 and an output terminal 140 and is opened/closed in response to an output signal from the fuse circuit 136, and an MOS transistor 138 connected between the output terminal 140 and the ground potential. The fuse circuit 136 includes, as does the address program circuit 86, a fuse 131, a capacitor 132, a high resistance 133, a P channel transistor 134 and a CMOS inverter 135.

In operation, when the fuse 131 is cut, current flows from the supply terminal through the capacitor 132 and the high resistance 133 to the input of the inverter 135, the input terminal of the inverter 135 attains "H" level and the output terminal of the inverter 135 attains "L" level. Therefore, the transfer gate 137 is turned on to pass the input data (output from the address program circuit 86). If the fuse 131 is not cut, the output terminal 140 is fixed to "L" level by means of the N channel transistor 138.

FIG. 27 is a schematic diagram showing the transmission gate circuits TG1 and TG2, the bit lines and the memory cells shown in FIG. 23. Referring to FIG. 27, the transmission gate circuit TG1 is connected between the bit line pair BLa, BLb in a normal memory cell array and a data line pair DLa and DLb. The transmission gate circuit TG2 is connected between a bit line pair RBLa and RBLb in a spare memory cell column and the data line pair DLa and DLb in a spare memory cell. FIG. 27 includes only one TG2, but actually there exist as many TG2s as the number of I/Os. The transmission gate circuit TG1 is turned on in response to a column selecting signal $Y_L$ at a high level applied from a column decoder (not shown), and therefore the bit line pair BLa and BLb is electrically connected to the data line pair DLa and DLb. Since the supply potential Vcc is applied to the gate of the NMOS transistor 89, the transistor 89 is turned on. However, since the transistor 89 has high channel resistance, the potential of the column selecting signal $Y_L$ is not influenced. Therefore, the column selecting signal $Y_L$ at the high level is correctly applied to the transmission gate circuit TG1 through a fuse 88.

If there is a defect in the memory cell MC1, the fuse 88 is cut. Therefore, the ground potential is applied to the transmission gate circuit TG1 through the transistor 89, and the transmission gate circuit TG1 is turned off. If a column address signal selecting the column where the memory cell MC1 exist is applied, a high level signal RY is applied to the transmission gate circuit TG2 through the I/O program circuit 87. Consequently, the transmission gate circuit TG2 is turned on, and as a result, the column including the memory cell MC1 is functionally replaced by the spare memory cell column 81.

As described above, the conventional semiconductor memory includes a plurality of memory cell arrays and one or two spare memory cell column provided corresponding to each memory cell array. Therefore, an SRAM having 64 memory cell arrays, for example, has a capability of repairing 64 or 128 defective memory cell columns. However, actually, the necessary capability of repairing is not so large. It is known from the experience that there is not so much defects in the semiconductor memory device. It is known that there may possibly be 10 defects at the most in the above mentioned SRAM. In other words, the conventional semiconductor memory has excessive spare memory columns or rows which are not necessary in actual use. Consequently, high degree of integration of the semiconductor memory has been prevented.

In addition, since the conventional spare memory column or row is provided per one memory array, it cannot be used for repairing a column or row in another memory cell array. In other words, if there are defects in three or more memory cell columns or rows, the defects cannot be repaired by using one or two spare memory columns or rows, and in such a case, repairing was impossible.

Further, as the pattern forming the memory cells becomes smaller and smaller, there is a high possibility that one defect bridges a plurality of columns, which leads to a problem that the semiconductor memory device itself cannot be repaired even if one column of memory cells can be repaired.

SUMMARY OF THE INVENTION

An object of the present invention is to effectively repair a memory cell array including a defect existing over a plurality of columns in view of higher degree of integration, in a semiconductor memory device including a plurality of memory cell arrays.

Briefly stated, the semiconductor memory device includes a plurality of memory cell array blocks, at least one redundant memory cell array block, an address coincidence detector and a redundant block access circuit. The plurality of memory cell array blocks each includes memory cells arranged in rows and columns. At least one redundant memory cell array block includes redundant memory cells arranged in a plurality of rows and columns. The address coincidence detector stores address signals indicating at least two adjacent columns, one at least of which is defective, in at least one memory cell array block. It detects coincidence between an input address signal and a stored defective address signal. The redundant block access circuit is responsive to said address coincidence detector and it accesses at least two columns of at least one redundant memory cell array block and it replaces at least two adjacent columns in at least one memory cell array block.

In operation, at least one redundant memory cell array block is provided, and when an access to the defective columns of the plurality of memory cell arrays is requested externally, the redundant block access circuit can access at least one redundant memory cell array block simultaneously. Therefore, even when the defects are in adjacent two columns, the memory cell array including the defects can be repaired effectively in the view point of higher degree of integration, by using at least one redundant memory cell array.

A semiconductor memory device in accordance with another aspect of the present invention includes a plurality of memory cell array blocks, at least two redundant memory cell array blocks, an address coincidence detector and a redundant block access circuit. The plurality of memory cell array blocks each includes memory cells arranged in rows and columns. At least two redundant memory cell array blocks each include redundant memory cells arranged in a plurality of rows and columns, it replaces all defective columns in all blocks of the semiconductor memory device, and each redundant memory cell array block has a row decoder for accessing a corresponding redundant memory cell array block. The address coincidence detector stores address signal indicating at least two adjacent columns, one at least of which is defective in at least one memory cell array block and detects coincidence between an input address signal and the stored defective address signal. The redundant block access circuit is responsive to the address coincidence detector and it accesses at least one column of each redundant memory cell array block and it replaces at least two columns in the at least one memory cell array block.

In operation, the semiconductor memory device in accordance with another aspect can replace, when there is a defective column in any of the memory cell array blocks, the defective column by one redundant block and replace the column adjacent to the defective column by a column of the other redundant block. By dividing the redundant block into at least two, the length of one side (word line) of the redundant block can be reduced to one half or shorter, which leads to reduction of current consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2A is a schematic diagram of the redundant blocks RB1 and RB2 shown in FIG. 1.

FIG. 2C is an illustration of replacement of the defective column at an access to redundant blocks RB1 and RB2.

FIG. 10 is a block diagram showing another embodiment of the semiconductor memory device in accordance with the present invention.

DESCRIPTION OF THE PREFERRED EMBODIMENTS

Figure 1:
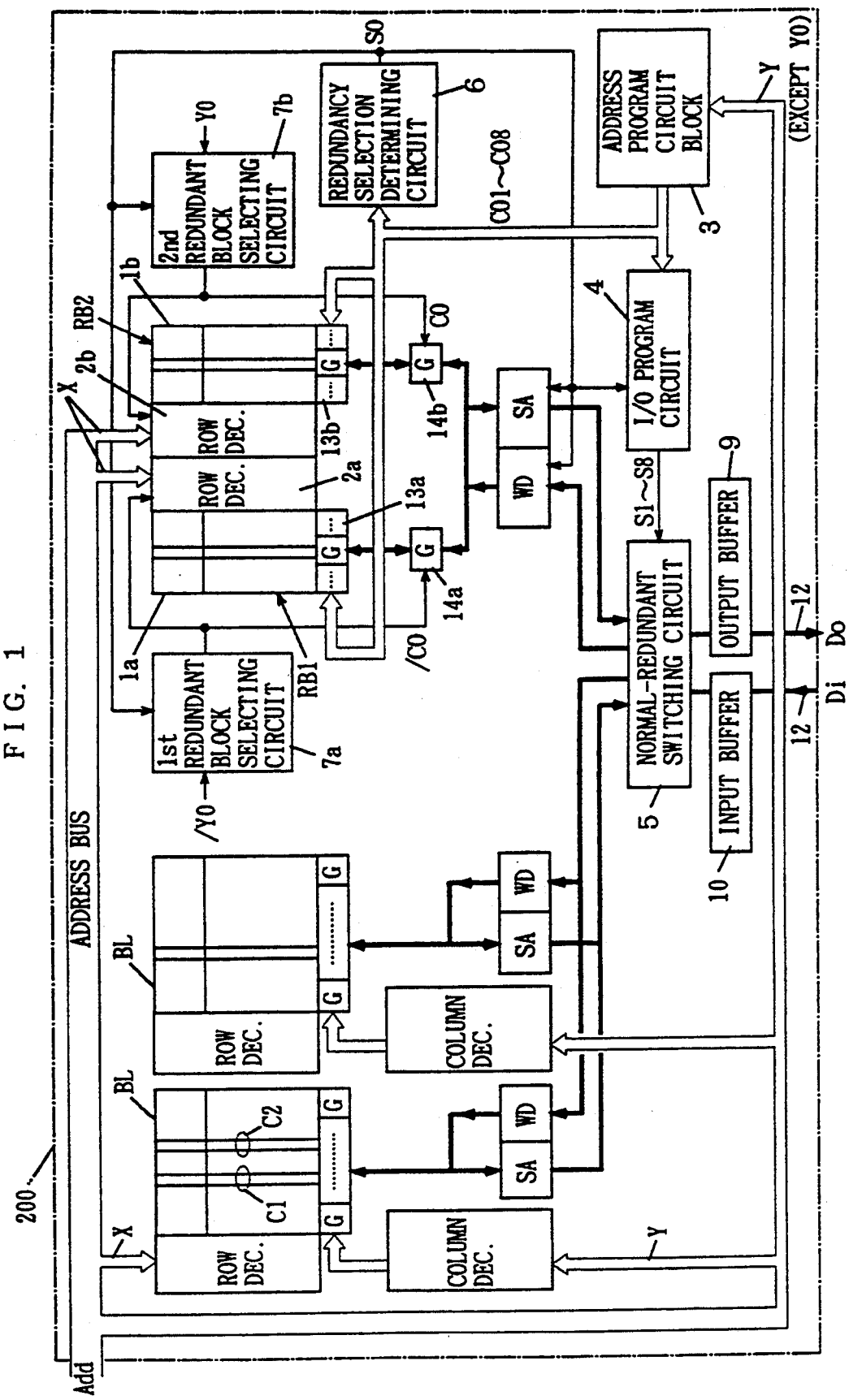
FIG. 1 is a schematic diagram showing one embodiment of the semiconductor memory device in accordance with the present invention.

FIG. 1 is a block diagram showing the SRAM in accordance with one embodiment of the present invention. Referring to FIG. 1, the SRAM 200 includes a total of 64 blocks BL each including a memory cell array, a redundant block RB1 including a redundant memory cell array 1a, and a redundant block RB2 including a redundant memory cell array 1b. For simplicity of description, only two blocks BL are shown in FIG. 1.

The SRAM 200 includes, as the peripheral circuit of the blocks RB1 and RB2, an address program circuit block 3, an I/O program circuit 4, a normal-redundant switching circuit 5, a redundancy selection determining circuit 6, a first redundant block selecting circuit 7a and a second redundant block selecting circuit 7b.

Figure 23:
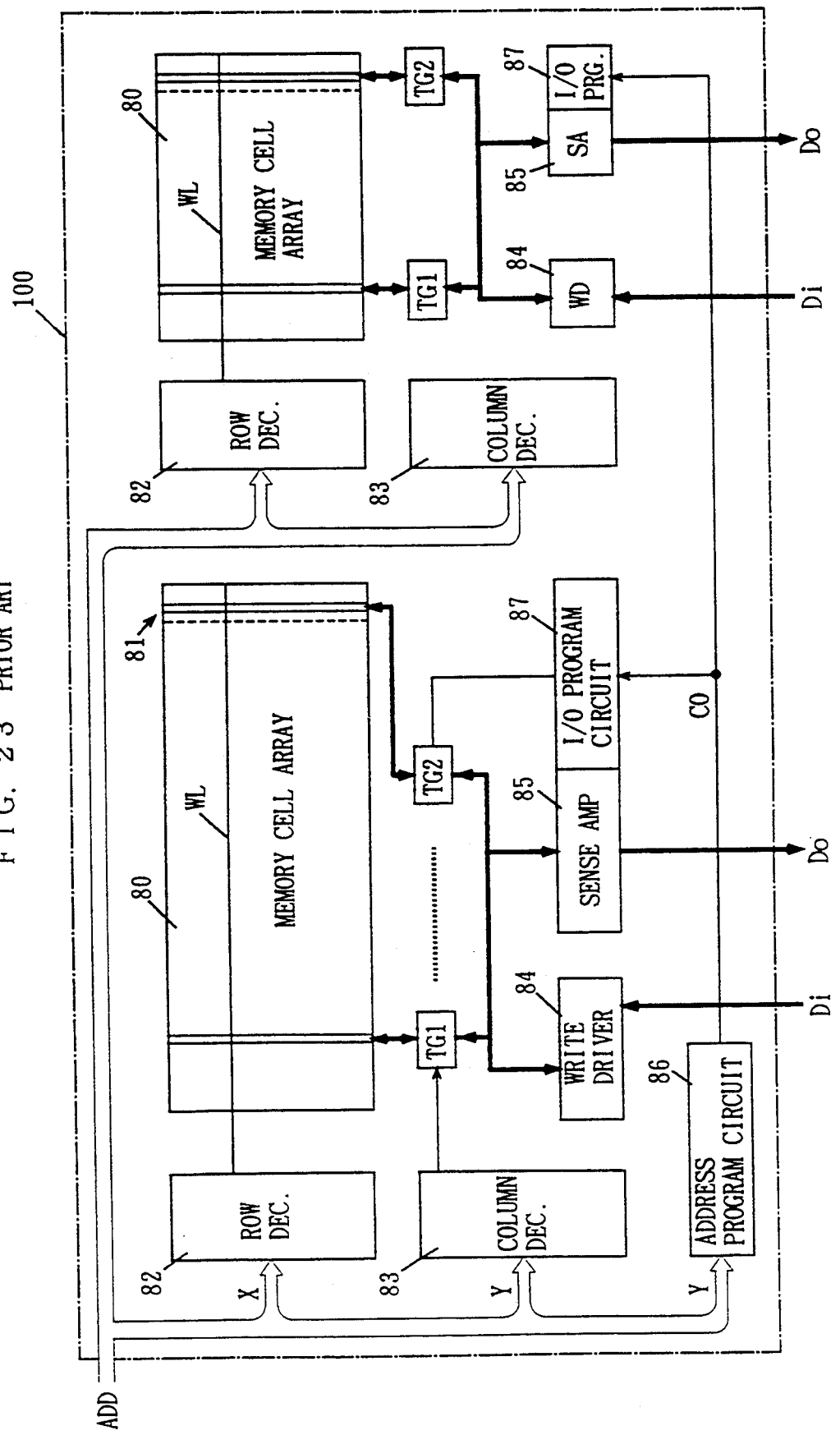
FIG. 23 is a block diagram of the conventional SRAM including a redundancy circuit.

The block BL includes a memory cell array divided into 8 areas, a row decoder, a column decoder, a sense amplifier circuit including 8 sense amplifiers (not shown), 8 write driver circuits (not shown) and a transfer gate G. In each block, the basic circuit structure of the memory cell array and the peripheral accessing circuit are the same as in the conventional SRAM except that the spare memory cell column is not provided in each block. Different from the one shown in FIG. 23, the transfer gate G directly receives the column selecting signal Y, not through a fuse.

The redundant block RB1 includes a redundant memory cell array 1a including a total of 8 redundant memory cell columns, a row decoder 2a, a first switching circuit 13a and a second switching circuit 14a. Similar to the redundant block RB1, the redundant block RB2 includes a redundant memory cell array 1b including a total of 8 redundant memory cell columns, a row decoder 2b, a first switching circuit 13b and a second switching circuit 14b. Since the redundant blocks RB1 and RB2 have the same structure, only the redundant block RB1 will be described in the following. The row decoder 2a is activated by the 1st redundant block selecting circuit 7a, and selectively activates a word line (not shown) in the redundant memory cell array 1a in response to a row address signal X applied through an address bus 11. The first switching circuit 13a connects, responsive to one of the signals CO1 to CO8 which has been activated, which are applied from the address program circuit block 3, a corresponding one of the redundant memory cell columns to the second switching circuit 14a. The second switching circuit 14a connects the first switching circuit 13a to the sense amplifier circuit and/or the write driver circuit, in response to a block selecting signal /CO (which will be described later) from the first redundant block selecting circuit 7a.

By the test before shipment, whether or not there is a defect in the total of 64 memory cell arrays is inspected. If there are defects in adjacent two columns of a memory cell array, the addresses indicating the positions of the defective memory cell columns (except the least significant address Y0) are programmed in the address program circuit block 3. The address program circuit block 3 is capable of programming addresses indicating a total of 8 defective memory cell columns (hereinafter referred to as "defect addresses").

When an access to the defective memory cell column is requested externally, the address program circuit block 3 detects coincidence between the programmed address and the externally applied column address, and applies a coincidence detection signal (one of the signals CO1 to CO8) to the I/O program circuit 4, the redundancy selection determining circuit 6 and the first switching circuits 13a and 13b. In response to the applied coincidence detection signals CO1 to CO8, the redundancy selection determining circuit 6 determines whether or not an access to the redundant memory cell array is requested. If it determined that such request is done, it applies a determination signal S0 to the I/O program circuit 4, the first redundant block selecting circuit 7a, the second redundant block selecting circuit 7b and the sense amplifier circuit and/or the write driver circuit. The least significant column address signal Y0 is applied to the second redundant block selecting circuit 7b, and a signal /Y0 which is complementary to the least significant column address signal Y0 is applied to the first redundant block selecting circuit 7a. In response to the determination signal S0 from the redundancy selection determining circuit 6 and the signal /Y0, the first redundant block selecting circuit 7a generates a block selecting signal /CO for turning on the second switching circuit 14a and for activating a row decoder 2a. In response to the determination signal S0 from the redundancy selection determining circuit 6 and the least significant column address signal Y0, the second redundant block selecting circuit 7b generates a block selecting signal CO for turning on the second switching circuit 14b and for activating a row decoder 2b. The generated block selecting signals CO and /CO are applied to the second switching circuits 14a and 14b and row decoders 2a and 2b, respectively. Consequently, the second switching circuits 14a and 14b are turned on and connect the first switching circuits 13a and 13b to the sense amplifier and/or the write driver circuit.

Row decoders 2a and 2b are selectively activated by block selecting signals /CO and CO, and activate one word line corresponding to the row address signal X. Since redundant block is divided into blocks RB1 and RB2, the length of the word line becomes one half as compared with one, not-divided redundant block. Therefore, current consumption can be reduced. The fact that current consumption increases in proportion to the length of one side of the redundant block, that is, the word line length will be described with reference to FIG. 2B later.

The I/O program circuit 4 generates input/output control signals S1 to S8 in response any one of the coincidence detection signals CO1 to CO8 applied from the address program circuit block 3 and applies the generated input/output control signals S1 to S8 to the normal-redundant switching circuit 5. The normal-redundant switching circuit 5 includes 8 switching circuits, not shown, and these switching circuits are selectively turned on in response to the input/output control signals S1 to S8, whereby the two redundant memory cell columns are accessed instead of accessing to the defective memory cell columns.

The input buffer 9 receives externally, an input data Di to be written and applies the input data Gi to the write driver circuit (WD). Consequently, the input data Di is written to a memory cell designated by the row decoder and the column decoder. In the following, details of the SRAM 200 shown in FIG. 1 will be described.

Figure 2B:
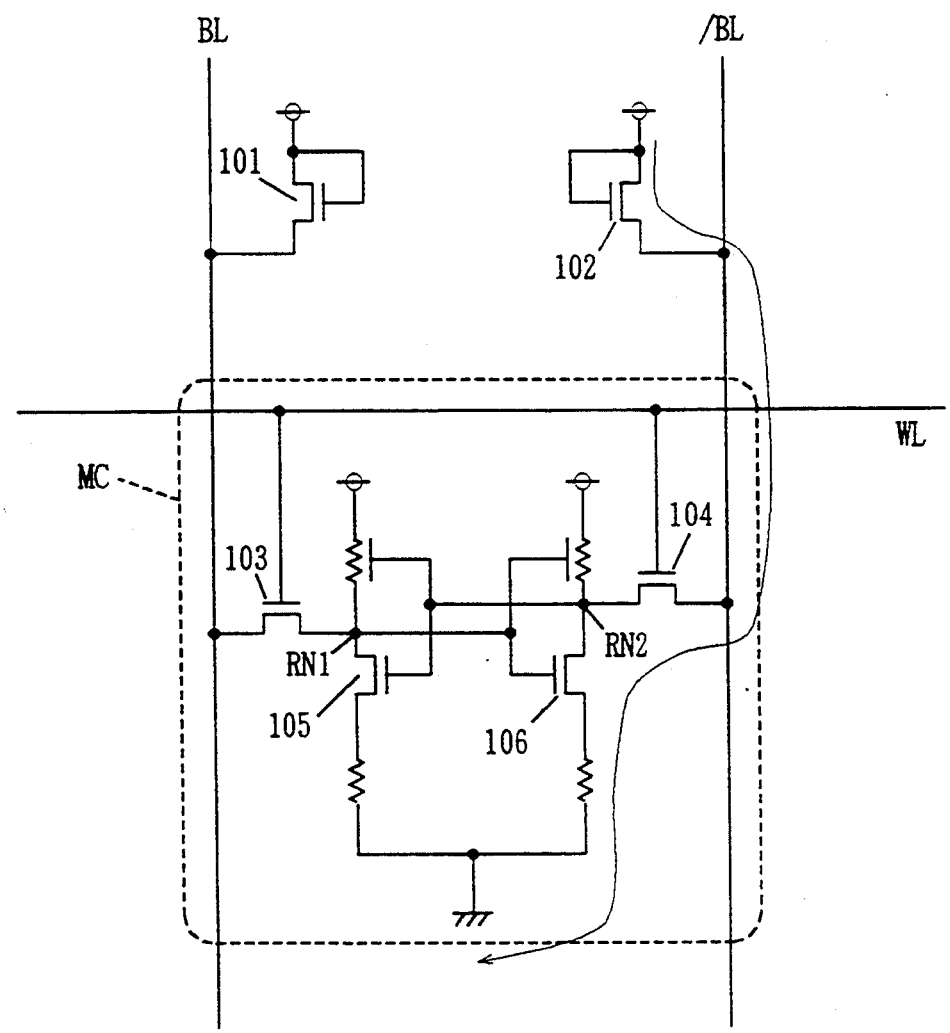
FIG. 2B shows connection between the bit lines BL and /BL and the memory cell of the redundant block RB1 shown in FIG. 2A.

FIG. 2A is a schematic diagram of the redundant memory cell array 1a, the first switching circuit 13a and the second switching circuit 14a. FIG. 2B shows connection between the bit lines BL and /BL with the memory cell of the redundant block RB1 shown in FIG. 2A.

Referring to FIG. 2A, the redundant memory cell array 1a includes memory cells MC arranged in rows and columns. The redundant memory cell array 1a includes a total of 8 redundant memory cell columns RCL1 to RCL8. The word line WL1 or WL2 is selectively activated by the row decoder 2a shown in FIG. 1.

Referring to FIG. 2B, a memory cell MC includes access transistors 103 and 104, driver transistors 105 and 106, and storage nodes RN1 and RN2. A load transistor 101 called a bit line load is connected in the form of a source follower to the bit line BL, while a load transistor 102 is connected in the form of a source follower to the bit line /BL. The load transistors 101 and 102 are provided in order to set the potentials of bit lines BL and /BL to an intermediate potential between the supply voltage Vcc and the ground potential at the time of reading, so as to improve characteristics of the sense amplifier. More specifically, the bit line potential becomes Vcc-Vth.

In operation, when a word line WL rises, bit lines BL and /BL are connected to storage nodes RN1 and RN2 through access transistors 103 and 104, respectively. If it is assumed that the storage node on the side of the bit line BL is at a high level, the potential at the storage node RN1 on the side of the bit line BL attains to Vcc. However, since the access transistor 103 is source follower connected, the potential appearing at the bit line BL which corresponds to the source of the access transistor 103 is Vcc-Vth, and therefore there is no influence to the potential of the bit line BL. Meanwhile, noting the potential on the bit line /BL, since the potential at the storage node RN2 does not rise to Vcc-Vth, the potential at the bit line /BL will be the potential determined by resistance division of load transistor 102, access transistor 104 and driver transistor 106. A through current as represented in an arrow in the figure flows through the aforementioned three transistors 102, 104 and 106 while this potential is attained. Therefore, if the number of memory cells connected to the word line is increased, the through current is also increased, resulting in larger current consumption. In the embodiment shown in FIG. 1, the redundant block is divided so that the length of the word line becomes one half. The redundant block may be divided so that the length of the bit line becomes one half.

Again referring to FIG. 2A, the first switching circuit 13a includes transmission gate circuits 701 to 708 each connected to a corresponding redundant memory cell column. The transmission gate circuits 701 to 708 are turned on in response to the corresponding one of the address coincidence detecting signals CO1 to CO8 applied from the address program circuit block 3. For example, the transmission gate circuit 701 turns on in response to the address coincidence detecting signal CO1 at high level and the bit line pair BLa and BLb in the redundant memory cell column RCL1 are connected to the data line pair DLa and DLb. More specifically, when a column address signal which coincides with the defect address program in the address program circuit block 3 is externally applied, one of the transmission gate circuits 701 to 708 turns on in response to the address coincidence detecting signal CO1 to CO8, and one of the redundant memory cell columns RCL1 to RCL8 is accessed. The second switching circuit 14a is connected to the transmission gate circuits 701 to 708, and turns on in response to the block selecting signal /CO generated from the first redundant block selecting circuit 7a. In the above description of FIG. 2, only the block RB1 and the first redundant block selecting circuit 7a are described. Similar operation is carried out in the redundant memory cell array block RB2 and the second redundant block selecting circuit 7b.

By this operation, the defective column in the normal memory cell array block BL is replaced as shown in FIG. 2C. FIG. 2C (1) shows an example in which there is a defective column in each memory cell array block BL, while FIG. 2C (2) shows an example in which there are continuous two defective columns in one memory cell array block BL.

Figure 3:
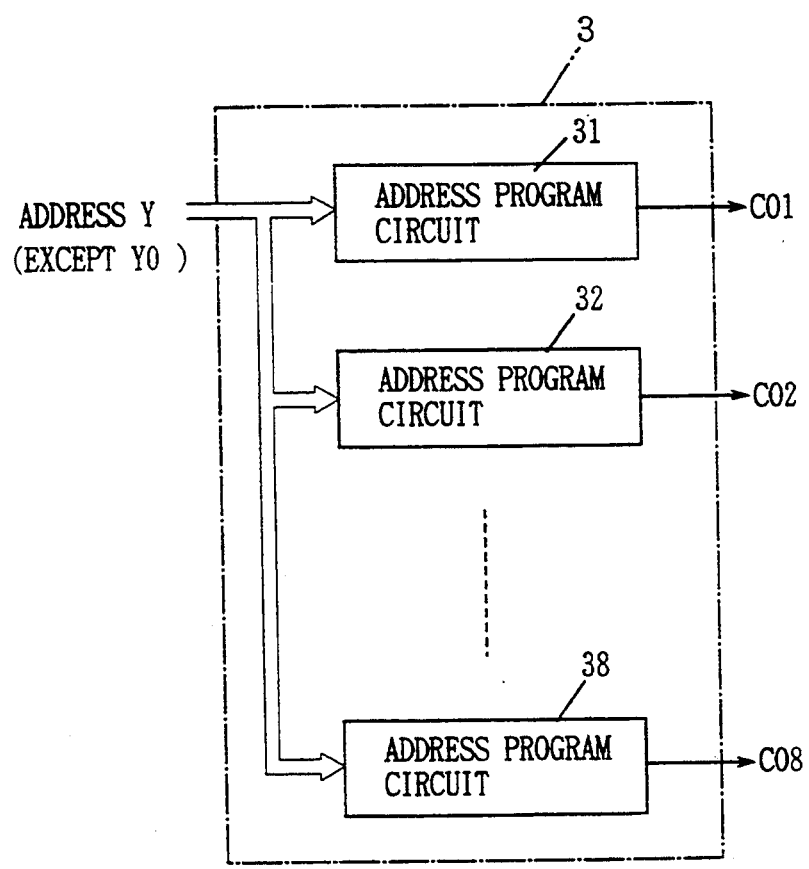
FIG. 3 is a block diagram of the address program circuit block 3 shown in FIG. 1.
Figure 24:
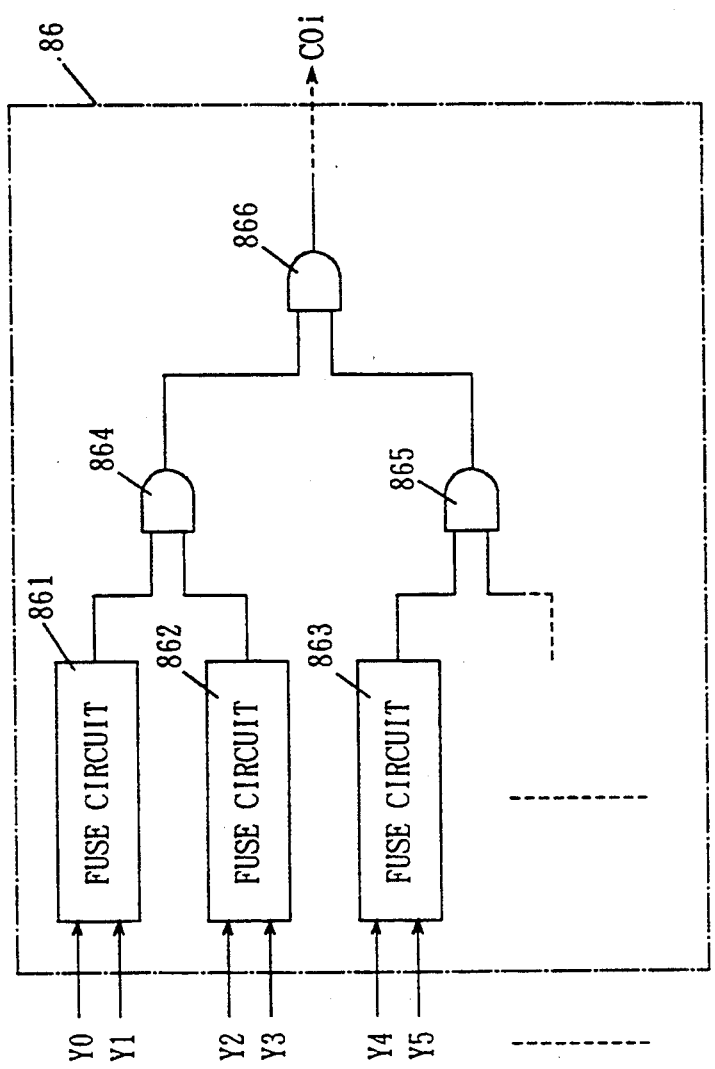
FIG. 24 is a block diagram of the address program circuit 86 shown in FIG. 23.
Figure 25:
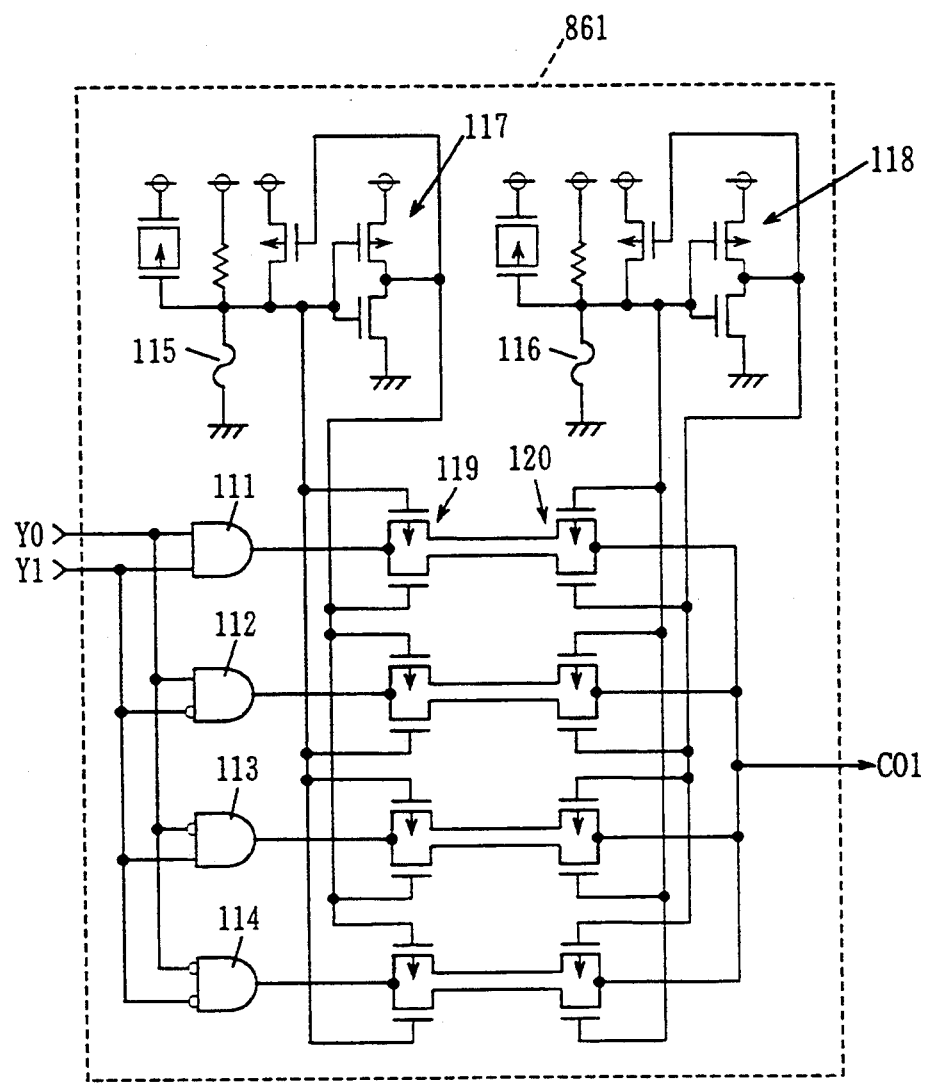
FIG. 25 is a schematic diagram of the fuse circuit 861 shown in FIG. 24.
Figure 26:
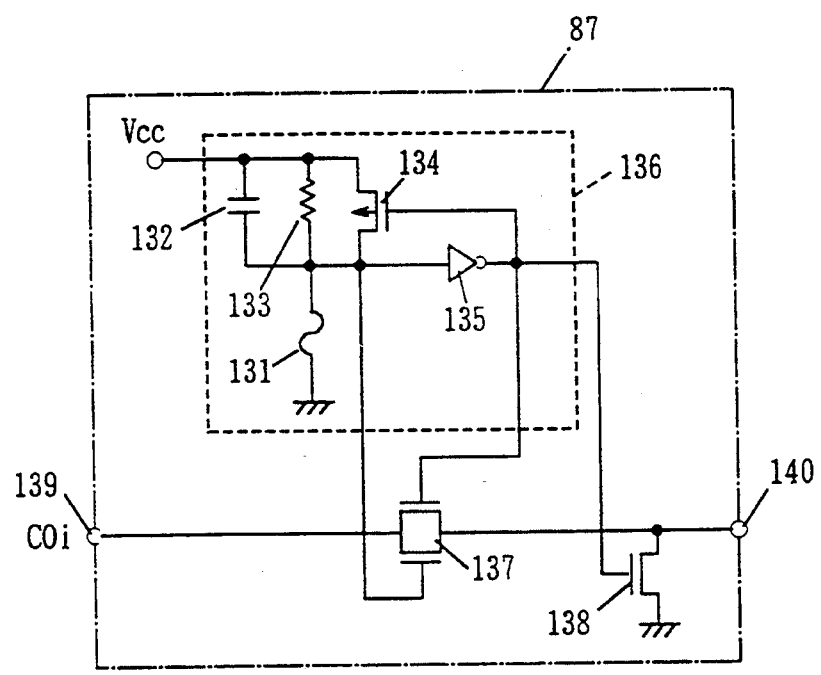
FIG. 26 is a schematic diagram of the I/O program circuit 87 shown in FIG. 23.
Figure 27:
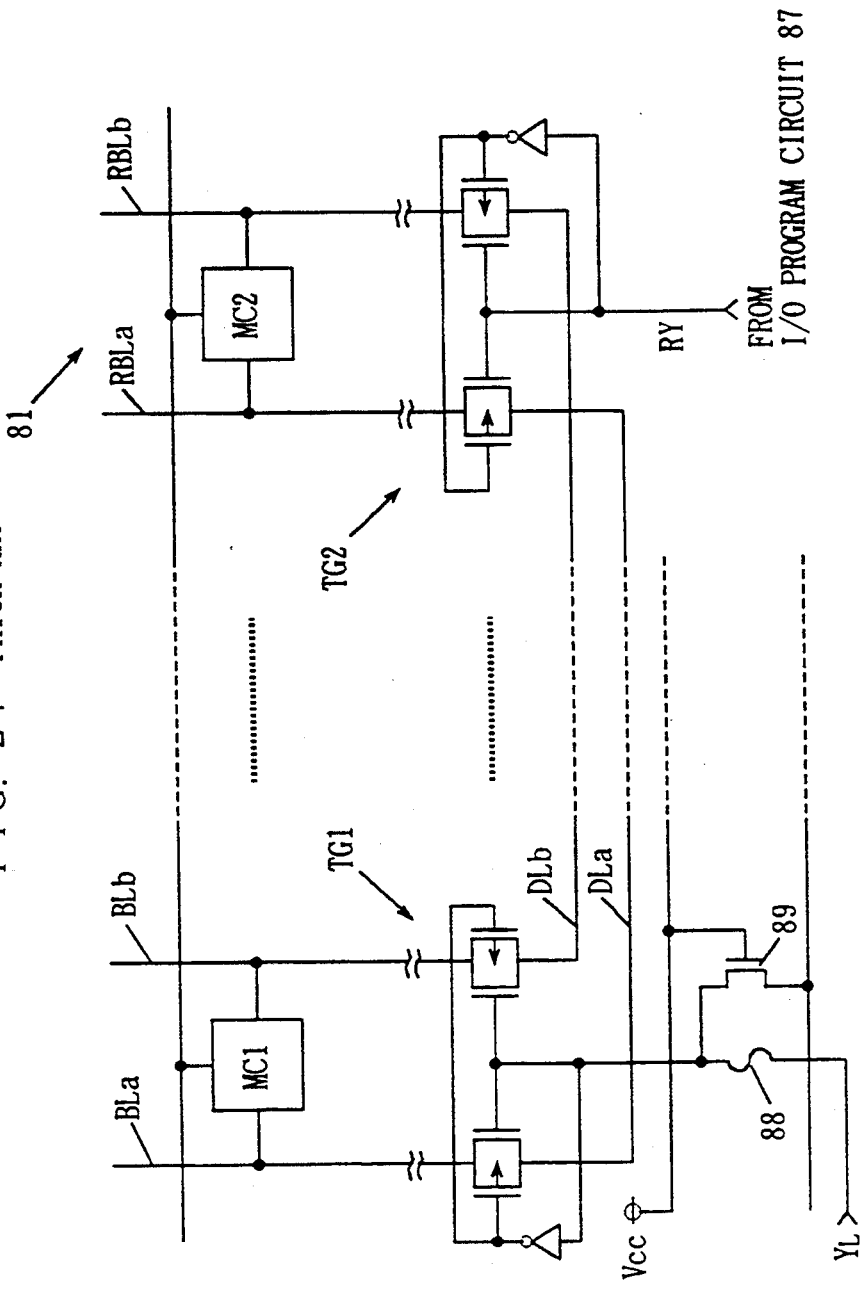
FIG. 27 is a schematic diagram of the transmission gate circuit shown in FIG. 23.

FIG. 3 is a block diagram of the address program circuit block 3 shown in FIG. 1. The address program circuit block 3 includes a plurality of address program circuits 31 to 38 provided corresponding to 8 memory cell columns of the redundant memory cell array blocks RB1 and RB2. The address program circuits 31 to 38 have the same structure as the address program circuit 86 shown in FIG. 24. Each of the address program circuits 31 to 38 compares the column address signal Y (except the least significant address Y0) with the programmed defect address, and when the column address signal Y coincides with the defect address, it outputs the coincidence detecting signals CO1 to CO8.

Figure 4:
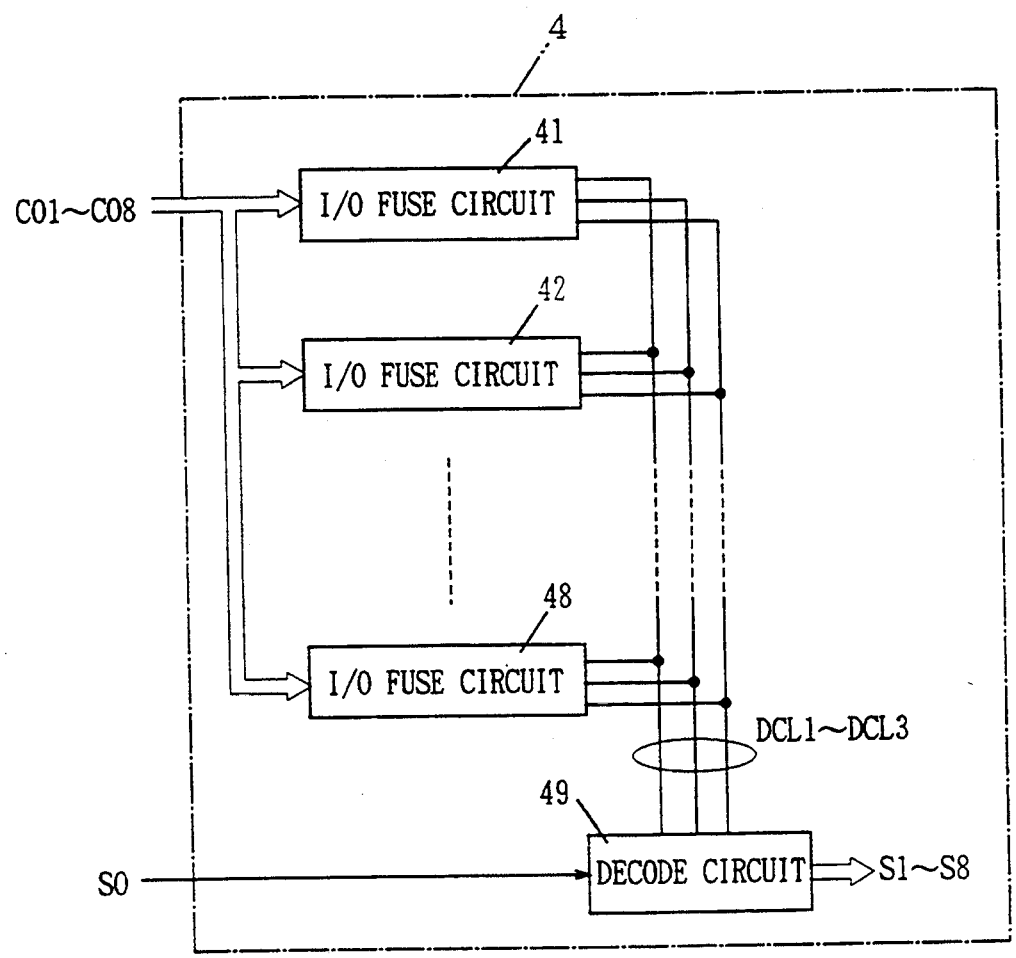
FIG. 4 is a block diagram of the I/O program circuit 4 shown in FIG. 1.

FIG. 4 is a block diagram showing the structure of the I/O program circuit 4. Referring to FIG. 4, the I/O program circuit 4 includes 8 I/O fuse circuits 41 to 48 provided corresponding to the 8 address program circuits 31 to 38, and a decoder circuit 49 for the defective column decoding. By an externally applied column address signal, 8 columns in one memory cell array can be simultaneously accessed, and therefore the defective memory cell column which should not be accessed must be programmed by the I/O program circuit 4. In other words, since an erroneous data may possibly be read from the defective memory cell column, the data read from the redundant memory cell column must be output in place of the data read from the defective memory cell column. Out of the 8 columns which can be accessed by one defect address, designation or programming of the column where the defect exists can be done by selectively cutting fuses of the fuse circuit 41 to 48.

The fuse circuits 41 to 48 generate defective I/O designating codes DCL1 to DCL3 in response to the coincidence detecting signals CO1 to CO8 from the address program circuit block 3. The decoder 49 decodes the defective I/O designating codes DCL1 to DCL3 output from the I/O fuse circuits 41 to 48 in response to the determination signal S0 from the redundancy selection determining circuit 6 and generate input/output control signals S1 to S8, respectively.

Figure 5:
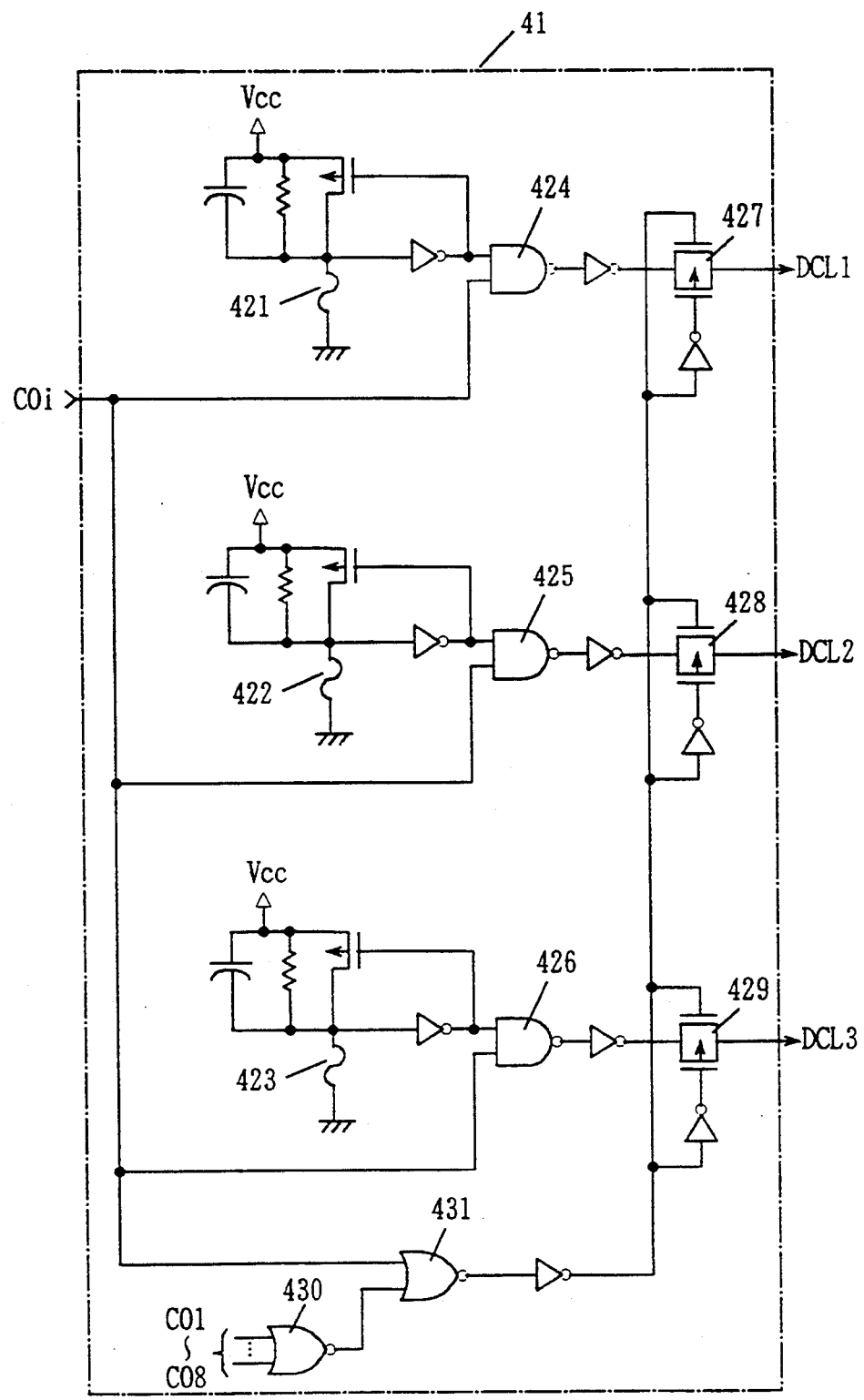
FIG. 5 is a schematic diagram of the I/O fuse circuit 41 shown in FIG. 4.

FIG. 5 is a schematic diagram showing the details of the fuse circuit 41 shown in FIG. 4. Referring to FIG. 5, the fuse circuit 41 includes, for programming, fuses 421 to 423, NAND gates 424 to 426, transmission gates 427 to 429 and NOR gates 430 and 431. In the fuse circuit 41, 8 I/O may be programmed by the fuses 421 to 423.

In operation, when the address coincidence detecting signal COi is at a low level, that is, when the redundancy is not selected, the NAND gates 424 to 426 always output a voltage at the high level, not dependent on the connection of the fuses 421 to 423. Therefore, when the transmission gates 427 to 429 are turned on, the defective I/O designating codes DCL1 to DCL3 at the low level are output, respectively.

When a high level address coincidence detecting signal COi is applied, that is, when the redundancy is selected, the NAND gates 424 to 426 output signals dependent on the connection of the fuses 421 to 423. For example, when the fuse 421 is connected, the NAND gate 424 receives a voltage at the high level. Thus the NAND gate 424 outputs a signal at the low level, and the incoming signal of the transmission gate 427 indicates a high level. Meanwhile, if the fuse 421 has been cut, the NAND gate 424 receives a signal at the low level. Consequently, the NAND gate 424 outputs a signal at the high level, and the incoming signal of the transmission gate 427 attains to the low level.

In short, when coincidence is detected in the corresponding address program circuit, that is, when the high level signal COi is output, the incoming signals of the transmission gates 427 to 429 indicate the high level or low level dependent on connection/cutting of the corresponding fuse. Meanwhile, if an address coincidence signal COi of the low level is applied, the incoming signals of the transmission gate 427 which are all at the low level are output. In other words, by selectively cutting the three fuses 421 to 423, one of the 8 memory cells which can be designated by one column address signal can be designated or programmed.

The three transmission gates 427 to 429 shown in FIG. 5 operate in the following manner. First, when all the address coincidence detecting signals CO1 to CO8 are at the low level, the NOR gate 430 applies a high level signal to the NOR gate 431. The NOR gate 431 outputs a signal at the low level and the transmission gates 427 to 429 are turned on. In this case, since the address coincidence detecting signal COi is at the low level, the defective I/O designating codes DCL1 to DCL3 which are all at the high level are output through the transmission gates 427 and 429.

When the signal COi is at the low level and one of the remaining address coincidence detection signals CO1 to CO8 is at the high level, the NOR gate 430 applies a signal at the low level to the NOR gate 431. Thus, the NOR gate 431 receives two signals which are at the low level, and outputs a signal at the high level. Consequently, transmission gates 427 to 429 are turned off. Consequently, collision of the defective I/O designating codes output from two or more fuse circuits can be prevented.

When an address coincidence detecting signal Coi at the high level is applied, the NOR gate 431 outputs a low level signal. Consequently, transmission gates 427 to 429 are turned on, and the defective I/O designating codes DCL1 to DCL3 which are determined dependent on the state of connection of the fuses 421 to 423 are output.

Figure 6:
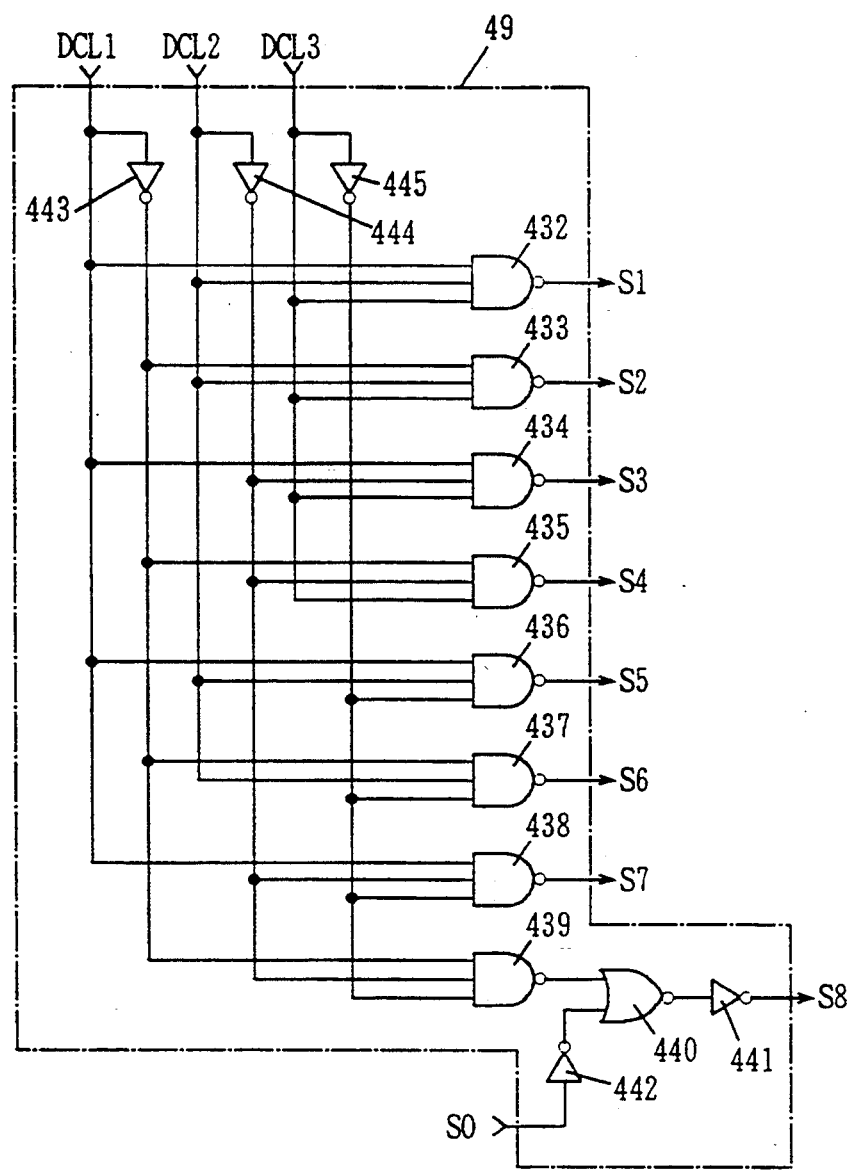
FIG. 6 is a schematic diagram of the decode circuit 49 shown in FIG. 4.

FIG. 6 is a schematic diagram of the decode circuit 49 provided in the I/O program circuit 4 shown in FIG. 4. Referring to FIG. 6, the decode circuit 49 has its input connected to the output of 8 fuse circuits 41 to 48. One of the fuse circuits 41 to 48 outputs the defective I/O designating codes DCL1 to DCL3 in response to the address coincidence detection signals CO1 to CO8.

The decode circuit 49 includes 3-input NAND gates 432 to 439, a 2-input NOR gate 440 and inverters 441 to 445. When the address coincidence detection signals CO1 to CO8 are all at the low level (namely redundancy is not selected), the defective I/O designating codes DCL1 to DCL3 are at the low level. Therefore, the decode circuit 49 outputs input/output control signals S1 to S8 are all at the high level.

When one of the address coincidence detecting signals CO1 to CO8 is at the high level, one of the fuse circuits 41 to 48 outputs the defective I/O designating codes DCL1 to DCL3 showing an actual defective I/O at this time. The defective I/O designating codes DCL1 to DCL3 are decoded by the NAND gates 432 to 439, and one of the input/output control signals S1 to S8 attains to the low level. The 2-input NOR gate 440 has one input terminal connected to receive an output from the NAND gate 439 and the other input gate connected to an output of the inverter 442. The determination signal S0 output from the redundancy determining circuit 6 is at the high level when the redundancy is selected, and the output from the NOR gate 440 depends on the output level of the NAND gate 439. Therefore, the input/output control signal S8 output from the inverter 441 depends on the output level of the NAND gate 439. The input/output control signals S1 to S8 generated in the above described manner are applied to the normal-redundant switching circuit 5.

Figure 7:
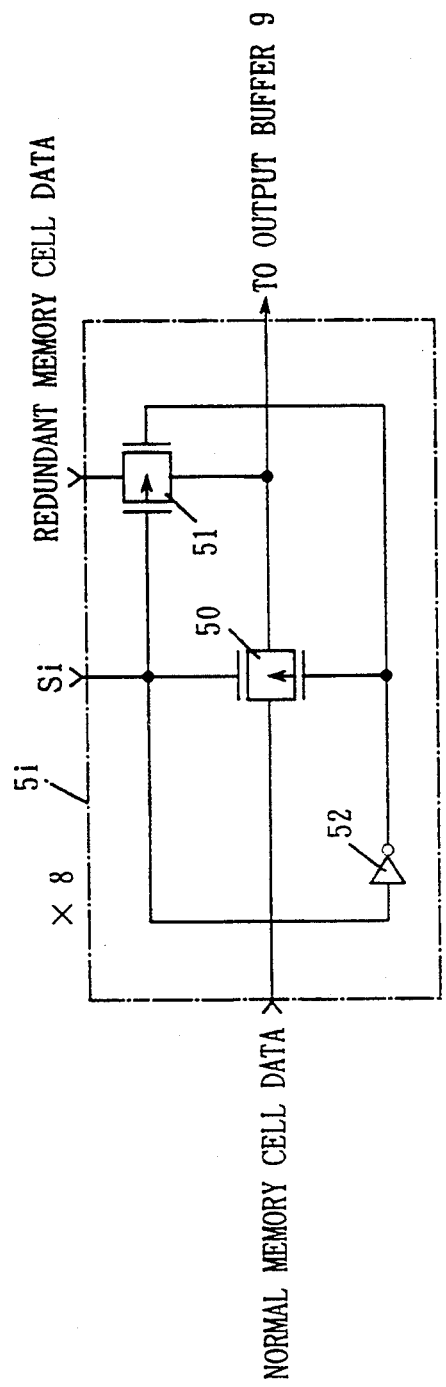
FIG. 7 is a schematic diagram of the normal-redundant switching circuit 5 shown in FIG. 1.

FIG. 7 is a schematic diagram of the normal-redundant switching circuit 5 shown in FIG. 1. 8 normal-redundant switching circuits 5 are provided corresponding to the number of I/Os of the memory cell array in general. However, 1 I/O of the switching circuit is shown in FIG. 7. Referring to FIG. 7, the switching circuit 5i of the ith I/O includes a transfer gate 50 receiving the normal memory cell data read from the normal memory cell array, a transfer gate 51 receiving the redundant memory cell data from the redundant memory cell arrays 1a and 1b, and an inverter 52 receiving the ith input/output control signal Si of the input/output control signals S1 to S8.

In operation, the transfer gates 50 and 51 are switched by the input/output control signal Si from the I/O program circuit 4. More specifically, the transfer gate 50 is turned on in response to the input/output control signal Si at the high level and applies the normal memory cell data to the output buffer 9. The transfer gate 51 is turned on in response to the input/output control signal Si at the low level and applies the redundant memory cell data to the output buffer 9.

Figure 8:
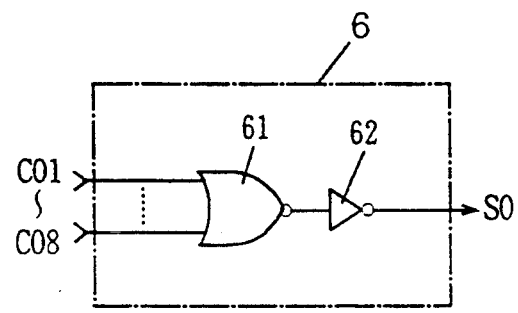
FIG. 8 is a schematic diagram of the redundancy selection determining circuit 6 shown in FIG. 1.

FIG. 8 is a schematic diagram of the redundancy selection determining circuit 6 shown in FIG. 1. Referring to FIG. 8, the redundancy selection determining circuit 6 includes an NOR gate 61 providing NOR of the coincidence detection signals CO1 to CO8 output from the address program circuits 31 to 38 and an inverter 62.

In operation, the NOR gate 61 provides an OR of the coincidence detection signals CO1 to CO8 so as to determine whether the redundancy is selected or not. When the redundancy is selected, one of the coincidence detection signals CO1 to CO8 output from the address program circuits 31 to 38 is always at the high level, and therefore the determination signal S0 attains high level. When the redundancy is not selected, the coincidence detection signals output from the address program circuits 31 to 38 are all at the low level, and therefore the redundancy selection signal S0 is at the low level. As a result, whether the redundancy is selected or not can be determined by the level of the determination signal S0.

Figure 9:
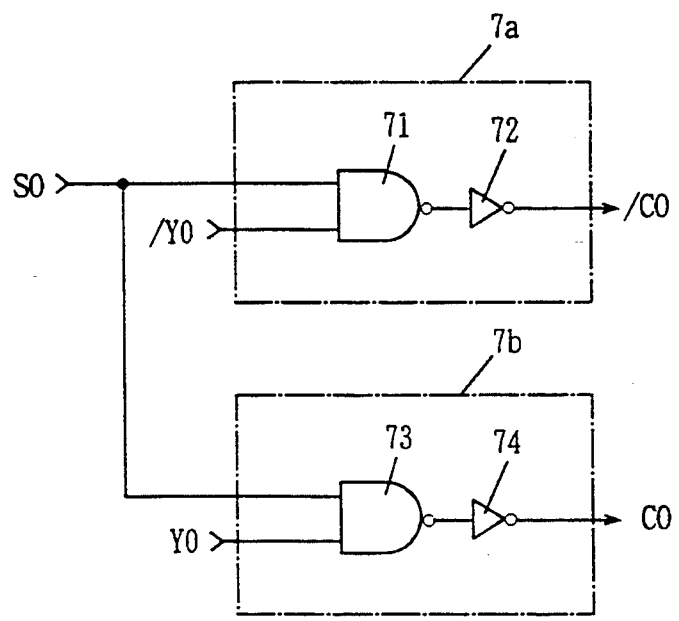
FIG. 9 is a schematic diagram of the first redundant block selecting circuit 7a and a second redundant block selecting circuit 7b shown in FIG. 1.

FIG. 9 is a schematic diagram of the first redundant block selecting circuit 7a and the second redundant block selecting circuit 7b shown in FIG. 1. Referring to FIG. 9, the first redundant block selecting circuit 7a includes an NAND gate 71 and an inverter 72. The second redundant block selecting circuit 7b includes an NAND gate 73 and an inverter 74. The NAND gate 71 provides an NAND of the determination signal S0 and the least significant address signal /Y0. The inverter 72 inverts the output from the NAND gate 71 and outputs a block selection signals /CO. The NAND gate 73 provides a NAND of the determination signal S0 and the least significant column address signal Y0 of the column address signal. The inverter 74 inverts the output from the NAND gate 73 and outputs the block selecting signal CO.

In operation, by the coincidence detection signal from the address program circuit block 3, data of two adjacent redundant memory cell columns are applied to the second switching circuits 14a and 14b.

In this state, when the least significant column address signal Y0 is at the high level, the block selecting signal /CO output from the first redundant block selecting circuit 7a is at the low level, and the second switching circuit 14a is kept off. Meanwhile, the block selecting signal CO output from the second redundant block selecting circuit 7b attains high level, and the second switching circuit 14b is turned on. By this structure, the adjacent two defective columns can be replaced by the memory cells of the redundant memory cell arrays 1a and 1b.

The operation of the semiconductor memory device shown in FIGS. 1 to 9 will be described.

When the redundancy is not selected, the coincidence detection signals CO1 to CO8 output from the address program circuit block 3 are all at the low level, the first switching circuits 13a and 13b of the redundant blocks RB1 and RB2 are both off, and data is not read from the first and second redundant memory cell arrays 1a and 1b. At the same time, the determination signal S0 output from the redundancy selection determining circuit 6 is at the low level, the block selecting signals CO and /CO output from the first and second redundant block selecting circuits 7a and 7b are at the low level, the second switching circuits 14a and 14b of the redundant blocks RB1 and RB2 are both off, and the data of the redundant memory cell arrays 1a and 1b are not transmitted to the sense amplifiers. As the determination signal S0 is at the low level, the sense amplifier is not activated, and therefore the data from the redundant memory cell array is not amplified by the sense amplifier and is not output. Since the coincidence detection signals CO1 to CO8 are at the low level, the input /output control signals S1 to S8 output from the I/O program circuit 4 are all at the high level, and the normal memory cell data amplified by the sense amplifiers in the normal memory cell array block BL are selected by the normal-redundant switching circuit 5. The data read in this manner are output to the data bus 12.

When the redundancy is selected, coincidence between the column address signal input through the address bus 11 and the defect address is detected by the address program circuit block 3 in which the defect address has been programmed in advance, and coincidence detection signals CO1 to CO8 are output. One coincidence detection signal COi of the coincidence detection signals CO1 to CO8 is at the high level. In response to the coincidence detection signal COi at the high level, the first switching circuits 13a and 13b are turned on, and the corresponding columns of the redundant memory cell arrays 1a and 1b are connected to the second switching circuits 14a and 14b. In this manner, data reading operation is carried out from one column of each of the redundant memory cell arrays 1a and 1b. The coincidence detection signals CO1 to CO8 are also applied to the redundancy selection determining circuit 6, and the determination signal S0 output from the redundancy selection determining circuit 6 attains the high level. The first redundant block selecting circuit 7a provides an AND of the determination signal S0 and the signal /Y0 and outputs a block selection signal /CO to the second switching circuit 14a. The second redundant block selecting circuit 7b provides an AND of the determination signal S0 and the least significant column address signal Y0 and outputs the block selecting signal CO to the second switching circuit 14b. The least significant column address signal Y0 is complementary to the signal /Y0, and therefore one of the block selecting signals CO and /CO attains to the high level while the other attains to the low level. In response to the block selecting signals CO and /CO which are complementary to each other, one of the second switching circuits 14a and 14b is turned on, the corresponding transfer gate of the first switching circuit is connected to the sense amplifier, and the data read from the redundant memory cell array is applied to the sense amplifier. When redundancy is selected, the determination signal S0 is at the high level, and the sense amplifiers in the redundant blocks RB1 and RB2 are activated. Thus the data input to the sense amplifiers are amplified and then transmitted to the normal-redundant switching circuit 5.

The coincidence detection signals CO1 to CO8 are also applied to the I/O program circuit 4, and the I/O program circuit 4 applies the input/output control signals S1 to S8 corresponding to the coincidence detection signals CO1 to CO8 to the normal-redundant switching circuit 5. More specifically, the I/O program circuit 4 sets one input/output control signal Si to the low level in response to the coincidence detection signal COi of the coincidence detection signals CO1 to CO8 which is at the high level. The normal-redundancy switching circuit 5 applies the redundant memory cell data of the corresponding I/O in response to the input-/output control signal Si to the output buffer 9, and in response to the input/output control signals other than the input/output signal Si, applies the normal memory cell data of the other I/OS to the output buffer 9. Consequently, correct data in which only the data of defective column is replaced by the redundant memory cell data can be read.

Although reading operation has been mainly described in the embodiment of FIGS. 1 to 9, in writing operation, a normal-redundant switching circuit for writing is added and write data of the column to be substituted should be input to the redundant bit line when redundancy is selected.

Figure 10A:
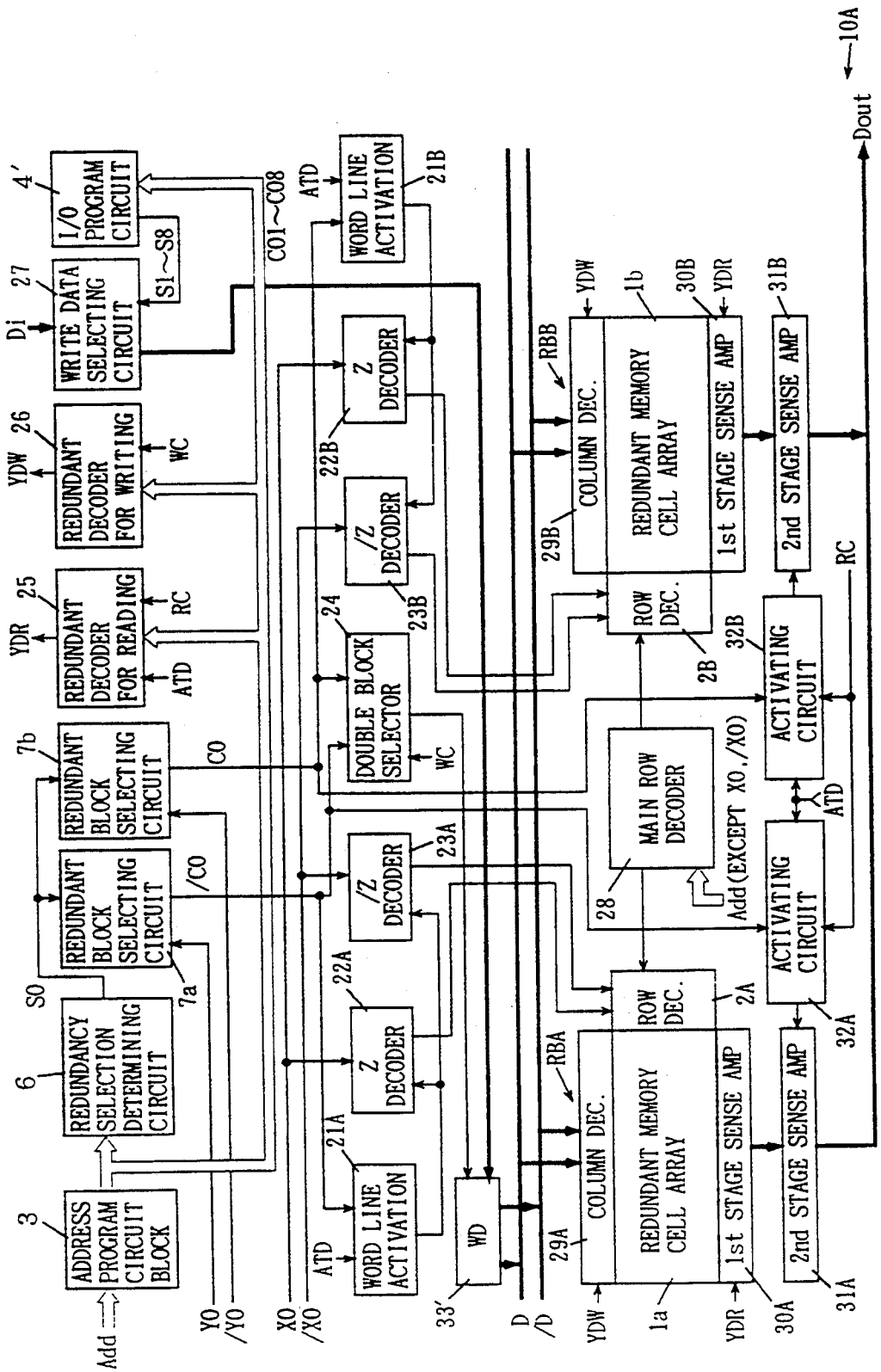
FIG. 10A is a block diagram showing a portion 10A for effecting redundant access of the semiconductor memory device.
Figure 10B:
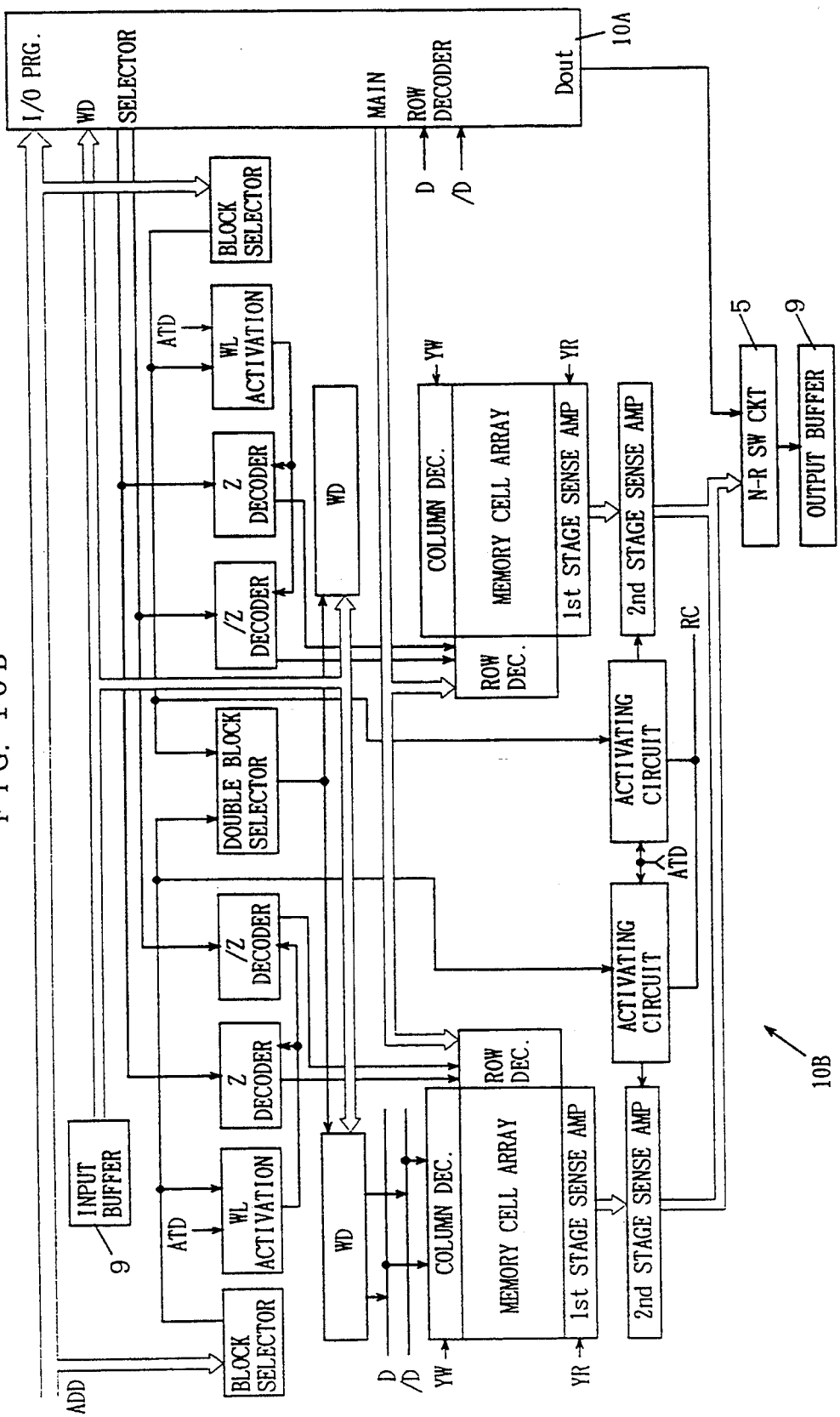
FIG. 10B shows a portion for effecting mainly the normal accessing operation in the semiconductor memory device.

FIG. 10A and 10B are block diagrams showing another embodiment of the semiconductor memory device in accordance with the present invention. FIG. 10A is a block diagram showing a portion effecting redundant access operation of the semiconductor memory device, and FIG. 10B is a block diagram showing a portion effecting normal access operation of the semiconductor memory device. The portion 10B shown in FIG. 10B differs from the conventional semiconductor memory device in that the redundant column is removed from each memory cell array. Each of the circuits has the same structure as shown in FIG. 10A, and detailed description thereof is not repeated.

Each circuit corresponding to those of FIG. 1 are denoted by the same reference characters.

Referring to FIG. 10A, the semiconductor memory device includes two redundant blocks RBA and RBB. The redundant block RBA includes a redundant memory cell array 1a, a row decoder 2A for selecting a row, a column decoder 29A for selecting a column, a first stage sense amplifier 30A for selectively amplifying data from the selected redundant memory cell, and a second stage sense amplifier 31A for further amplifying the redundant memory cell data which has been amplified by the first stage sense amplifier 30A. The redundant block RBB includes, as does the redundant block RBA, a redundant memory cell array 1b, a row decoder 2B, a column decoder 29B, a first stage sense amplifier 30B and a second stage sense amplifier 31B.

As the peripheral circuits of the redundant blocks RBA and RBB, an address program circuit block 3, an I/O program circuit 4', a redundant selection determining circuit 6 and first and second redundant block selecting circuits 7a and 7b are provided.

Different from the redundant blocks RB1 and RB2 shown in FIG. 1, in the semiconductor memory device, the column decoders 29A and 29B, the first stage sense amplifiers 30A and 30B and second stage sense amplifiers 31A and 31B are provided instead of the first and second switching circuits 13a and 13b and 14a and 14b.

Instead of the row decoder 2a of FIG. 1, a main row decoder 28 and row decoders 2A and 2B are provided.

Selection of a row address of the redundant block RBA is carried out by a word line activating circuit 21A, a Z decoder 22A, a /Z decoder 23A, the row decoder 2A and the main row decoder 28. More specifically, the word line activating circuit 21A provides an AND of the block selecting signals /CO and an ATD (Address Transition Detection: internal synchronization signal), and generates a word line activating signal. The Z decoder 22A provides an AND of the word line activating signal and a predecode signal X0 (least significant row address signal), and /Z decoder 23A provides an AND of the word line activating signa and the predecode signal /X0. The row decoder 2A provides an AND of the output from the Z decoder 22A and the output from the main row decoder 28, and an AND of the output from the /Z decoder 23A and the output from the main row decoder 28. The AND results in the row address selecting signal of the redundant memory cell array 1a. By applying this signal to a word line of the redundant memory cell array 1a, the word line can be raised to a high level.

Selection of a row address in the redundant block RBB is carried out by the word line activating circuit 21B, a Z decoder 22B, a /Z decoder 23B, the row decoder 2B and the main row decoder 28 in the similar manner as in the redundant block RBA. However, the block selecting signal CO used herein is complementary to the block selecting signals /CO used in the redundant block RBA. Therefore, when the least significant column address signal Y0 is at the high level, the selected word line of the memory cell array 1a is set to the high level, and if the least significant address signal /Y0 is at the high level, the selected word line in the memory cell array 1b rises to the high level.

The column address selecting signal in the redundant blocks RBA and RBB includes signals YDR for selecting a column address for reading (hereinafter referred to as the read column selecting signals YDR) and signals YDW for selecting a column address for writing (hereinafter referred to as write column selecting signal YDW). The write column selecting signal YDW is generated by the Y decoder 26 for writing. The Y decoder 26 for writing provides an AND of one of the coincidence detection signal CO1 to CO8 output from the address program circuit block 3 and the write control signal WC, and generates the write column selecting signals YDW. The write column selecting signal YDW is applied to the column decoders 29A and 29B, and the column decoders 29A and 29B transmit the redundant write data to the bit lines.

The selection of the redundant write data is carried out by a write data selecting circuit 27. The write data selecting circuit 27 selects the redundant write data from input 8 bits of data Di in response to the input/output control signals S1 to S8 from the I/O program circuit 4'. The selected redundant write data is applied to the write driver 33' and the write driver 33' applies the selected redundant write data to the column decoders 29A and 29B in response to an output of the double block selector 24. The double block selector 24 provides an OR of the block selecting signals CO and /CO, provides an NAND of the resulting signal of the OR operation and the write control signal WC, and applies the result to the write driver 33' as a write enable signal. The output of the double block selector 24 is active low. The outputs of the write driver 33' are complementary signals D and /D which correspond to the bit lines bit and /bit. The redundant write data is written to the bit lines having the same column address in the redundant blocks RBA and RBB by the double block selector 24. However, since the row decoders 2A and 2B are controlled by the block selecting signals CO and /CO, only one word line attains to the high level, and thus the redundant write data is not written to two memory cells. In reading, the read column address selecting signal YDR is applied to the first stage sense amplifiers 30A and 30B to activate the first stage sense amplifiers, and the redundant read data are transmitted to the second stage sense amplifiers 31A and 31B.

The read column selecting signal YDR is generated by the Y decoder 25 for reading. The Y decoder 25 for reading provides an AND of one of the coincidence detection signals CO1 to CO8 output from the address program circuit block 3 and the read control signal RC and generates the read column selecting signals YDR.

The sense amplifier activating circuit 32A activates the second stage sense amplifier 31A in response to the block selecting signal /CO. The sense amplifier activating circuit 32B activates the second stage sense amplifier 31B in response to the block selecting signal CO. The activated second stage sense amplifier 31A amplifies the redundant memory cell data from the first stage sense amplifier 30A and outputs the amplified data to the data bus. The activated second stage sense amplifier 31B transmits the redundant memory cell data from the first stage sense amplifier 30B to the data bus. As described above, since the block selecting signals CO and /CO are complementary to each other, the second stage sense amplifiers 31A and 31B are not simultaneously activated.

As described above, in writing, column selection is done by the column decoders 29A and 29B, and in reading, the column selection is done by activating the first stage sense amplifiers 30A and 30B. Therefore, one of the adjacent two redundant write data is written by the column decoder 29A of the redundant memory cell array 1a, and the other is written by the column decoder 29B of the redundant memory cell array 1b. The redundant data written in the redundant memory cell array 1a is read by the first stage sense amplifier 30A and amplified by the second stage sense amplifier 31A to a potential large enough to drive the data bus. The redundant data written to the redundant memory cell array 1b is read by the first stage sense amplifier 30B and is amplified to a potential sufficient to drive the data bus by the second stage sense amplifier 31B.

Since the semiconductor memory device shown in FIG. 10 operates in this manner, two defective columns next to each other can be effectively replaced.

The details of the SRAM shown in FIG. 10 will be described.

Figure 11:
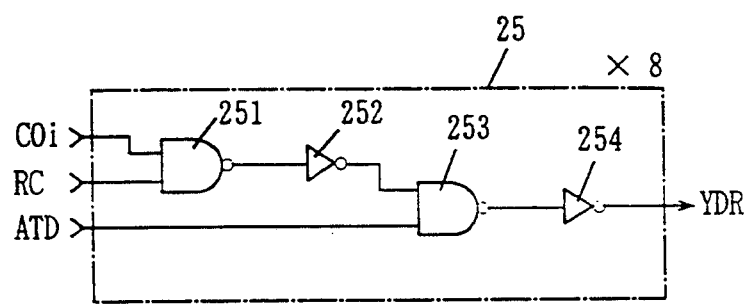
FIG. 11 is a schematic diagram of the Y decoder 25 for reading shown in FIG. 10A.

FIG. 11 is a schematic diagram of the Y decoder 25 for reading shown in FIG. 10A. Referring to FIG. 11, the Y decoder 25 for reading includes a 2-input NAND gate 251, an inverter 252 and an AND gate 254. Namely, the Y decoder 25 for reading includes a 3-input AND gate formed by the NAND gates 251 and 253 and inverters 252 and 254 which receive the redundant block selecting signal COi, the read control signal and the ATD signal.

In operation, when redundancy is not selected, the coincidence detecting signal COi is all at the low level, and therefore the read column selecting signal YDR output from the Y decoder 25 for reading is always at the low level.

When redundancy is selected, one of the coincidence detecting signal COi is at the high level and therefore the corresponding output of the NAND gate 251 is determined by the read control signal RC which is another input. Namely, in the writing state, the read control signal RC is at the low level, and therefore the output of the NAND gate 251 receiving this signal attains to the high level. The output of the NAND gate 251 is inverted by the inverter 252 to be the low level, and thus the output of the NAND gate 253 receiving this inverted signal attains the high level. The output of the NAND gate 253 is inverted by the inverter 254, and as a result, when the redundancy is selected and writing operation is being carried out, the read column selecting signal YDR is at the low level.

In the reading state when the redundancy is selected, the read control signal and one of the coincidence detection signal COi are at the high level, and the corresponding output of the NAND gate 251 receiving these signals is at the low level. The output of the NAND gate 251 is inverted by the inverter 252 to be at the high level, and the output of the NAND gate 253 receiving this inverted signal is determined by the level of the ATD signal, which is the other input. If the ATD signal is at the low level, the output of the NAND gate 253 will be at the high level. Therefore, the output of the NAND gate 253 is inverted by the inverter 254, resulting in the read column selecting signal YDR which is at the low level. Conversely, if the ATD signal is at the high level, the output of the NAND gate 253 is at the low level, the output of the NAND gate 253 is inverted by the inverter 254, and the resulting read column selecting signal YDR is at the high level.

As described above, the Y decoder 25 for reading outputs the read column selecting signal YDR (at the high level) only when the redundancy is selected, the reading is being carried out and the ATD signal is at the high level, and otherwise it outputs a signal of low level.

Figure 12:
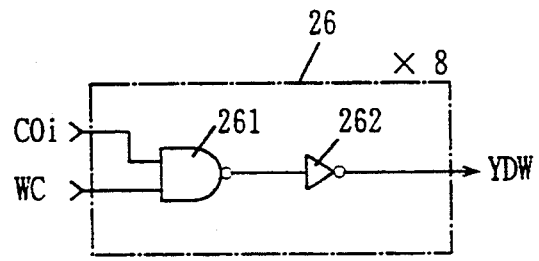
FIG. 12 is a schematic diagram of the Y decoder 26 for writing shown in FIG. 10A.

FIG. 12 is a schematic diagram of the Y decoder 26 for writing shown in FIG. 10A. Referring to FIG. 12, the Y decoder for writing includes a 2-input NAND gate 261 and an inverter 262 connected to an output terminal of the NAND gate 261. One input gate of the NAND gate 261 receives the coincidence detection signal COi and the other input gate receives the write control signal WC.

In operation, when redundancy is not selected, the coincidence detection signal COi is at the low level, and the output of the NAND gate 261 receiving this signal COi attains the high level. The output of the NAND gate 261 is inverted by the inverter 262 to attain the low level and therefore when redundancy is not selected, the write column selecting signal YWD is always at the low level.

When redundancy is selected, one of the coincidence detection signal COi is at the high level and the corresponding output of the NAND gate 261 receiving this signal is determined by the level of the write control signal WC which is the other input. More specifically in the writing state, the write control signal is at the high level, and the output of the NAND gate 261 receiving this signal attains the low level. The output of the NAND gate 261 is inverted by the inverter 262 to be at the high level, and thus the write column selecting signal YDW attains the high level. In the reading state, the write control signal is at the low level, and therefore the output of the NAND gate 261 receiving this signal attains the high level. The output of the NAND gate 261 is inverted by the inverter 262 to be the low level, and therefore the write column selecting signal YDW attains the low level. As described above, the Y decoder 26 for writing outputs the write column selecting signal YDW at the high level only when the redundancy is selected and writing is being carried out, and otherwise it outputs the signal at the low level.

Figure 13:
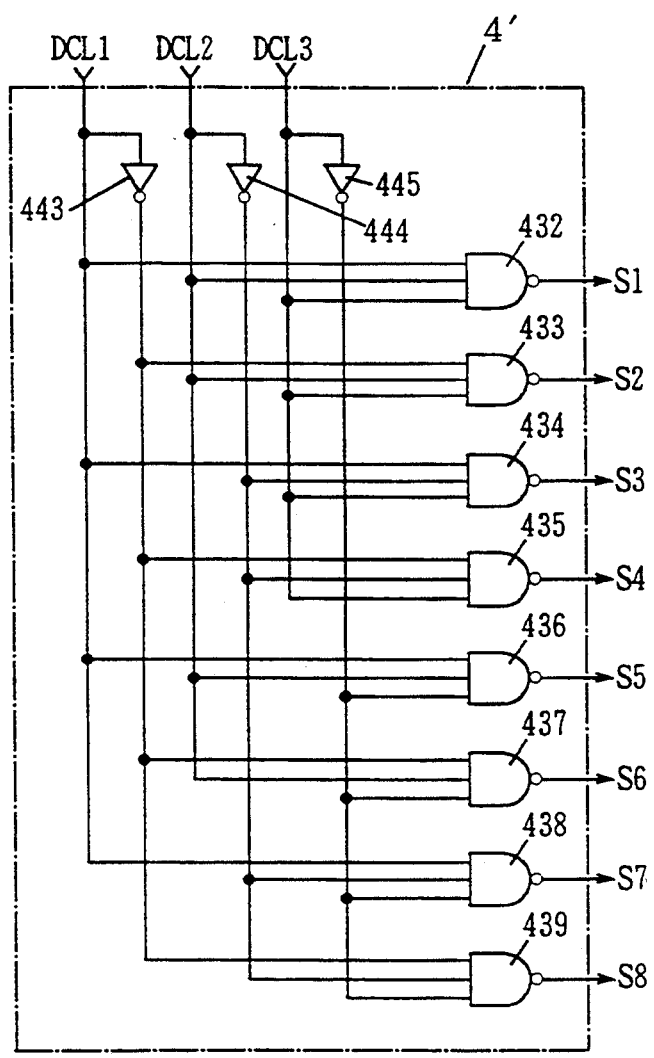
FIG. 13 is a schematic diagram of the I/O program circuit 4' shown in FIG. 10A.

FIG. 13 is a schematic diagram of the I/O program circuit 4' shown in FIG. 10A. In the I/O program circuit 4' only the decode circuit is different from the I/O program circuit shown in FIG. 4. In this decode circuit, the NOR gate 440 and inverters 441 and 442 of the decode circuit shown in FIG. 6 are not provided. Therefore, the NAND gate 439 outputs an input/output control signal S8 which attains the low level when redundancy is not selected. Other operations are the same as those of the I/O program circuit shown in FIGS. 4 to 6.

Figure 14:
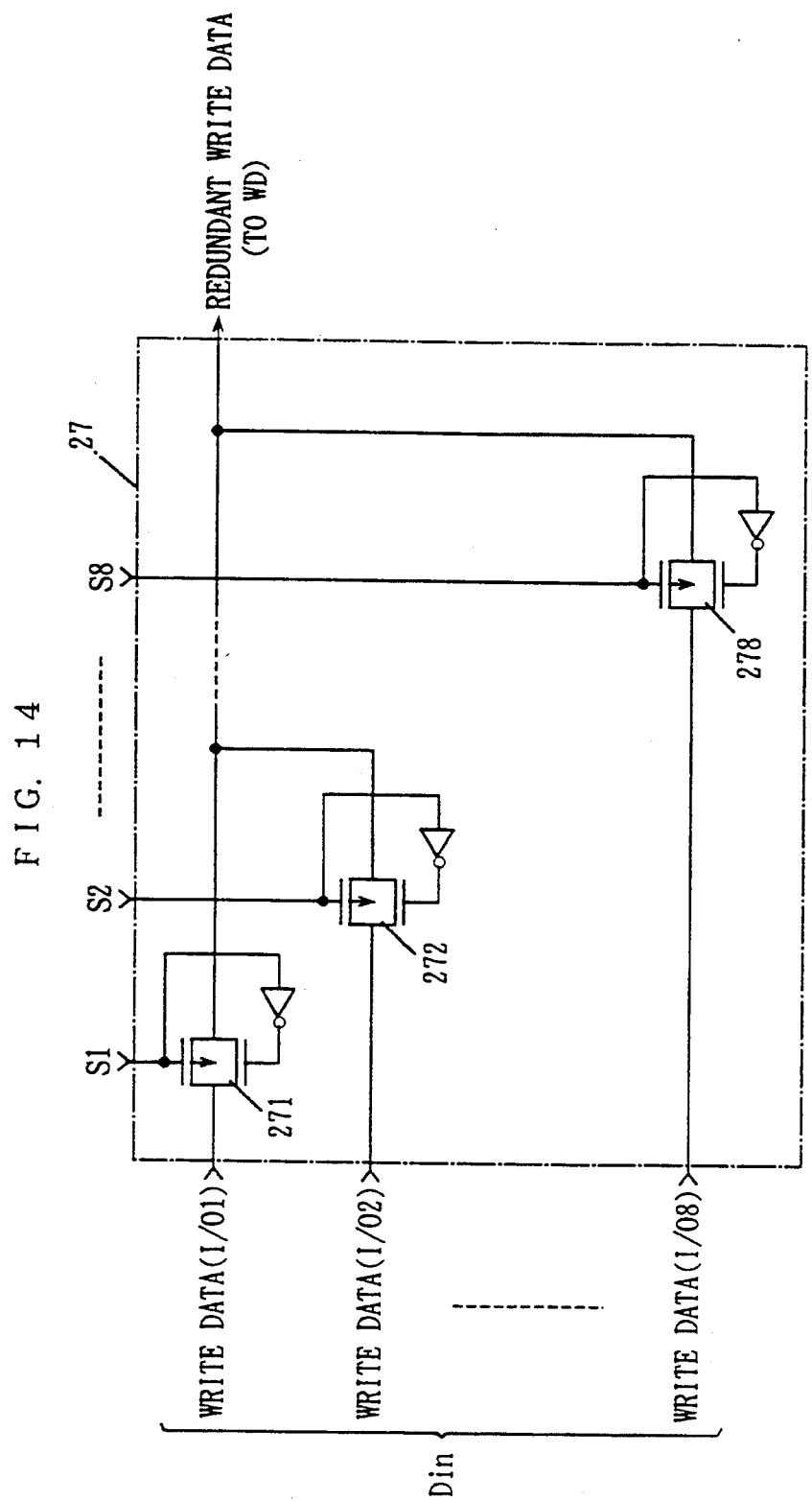
FIG. 14 is a schematic diagram of the write data selecting circuit 27 shown in FIG. 10A.

FIG. 14 is a schematic diagram of the write data selecting circuit 27 shown in FIG. 10A. Referring to FIG. 14, the write data selecting circuit includes transfer gates 271 to 278 provided corresponding to 8 bits of write data I/O1 to I/O8 included in the input data Din. Input /output control signals S1 to S8 output from the I/O program circuit 4' are applied to the transfer gates 271 to 278, respectively.

In operation, according to input/output control signals S1 to S8 from the I/O program circuit 4', one of the transfer gates 271 to 278 is turned on. The write data is applied to the write buffer 33 through the transfer gate which is turned on. Therefore, when redundancy is selected, only the transfer gate corresponding to the I/O to be replaced is turned on, and the write data corresponding to the I/O can be output as the redundant write data. If the redundancy is not selected, the input/output control signal S8 is at the low level, and therefore the transfer gate 278 corresponding to I/O8 is turned on, and outputs the write data corresponding to I/O8 as the redundant write data. The redundant write data output when the redundancy is not selected is simply to prevent the redundant write data line from being at the floating state.

Figure 15:
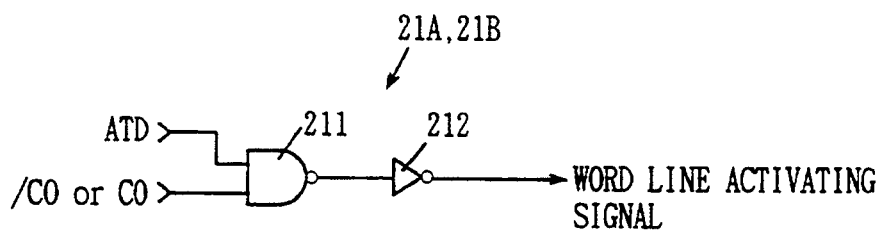
FIG. 15 is a schematic diagram of the word line activating circuits 21A and 21B shown in FIG. 10A.

FIG. 15 is a schematic diagram of the word line activating circuits 21A and 21B of FIG. 10A.

The word line activating circuits 21A and 21B differ only in the redundant block selecting signal and therefore these two circuits are shown by one diagram in FIG. 15. Referring to FIG. 15, each of the word line activating circuits 21A and 21B includes a 2-input NAND gate 211 and an inverter 212 connected to the output terminal of the NAND gate 211. The redundant block selecting signals /CO and the ATD signal are input to the AND gate 211 of the word line activating signal 21a, while the redundant block selecting signal CO and the ATD signal are input to the NAND gate 211 of the word line activating circuit 21B.

In operation, when the redundancy is not selected, the redundant block selecting signals CO and /CO are both at the low level, and therefore, the word line activating signals output from the word line activating circuits 21A and 21B are always at the low level. When redundancy is selected, one of the redundant block selecting signals CO and /CO attains to the high level while the other one attains to the low level in accordance with the least significant column address signals /Y0 or Y0, and the word line activating circuit receiving the redundant selection signal which is at the high level generates a pulse signal (word line activating signal) in accordance with the level of the ATD signal.

Figure 16:
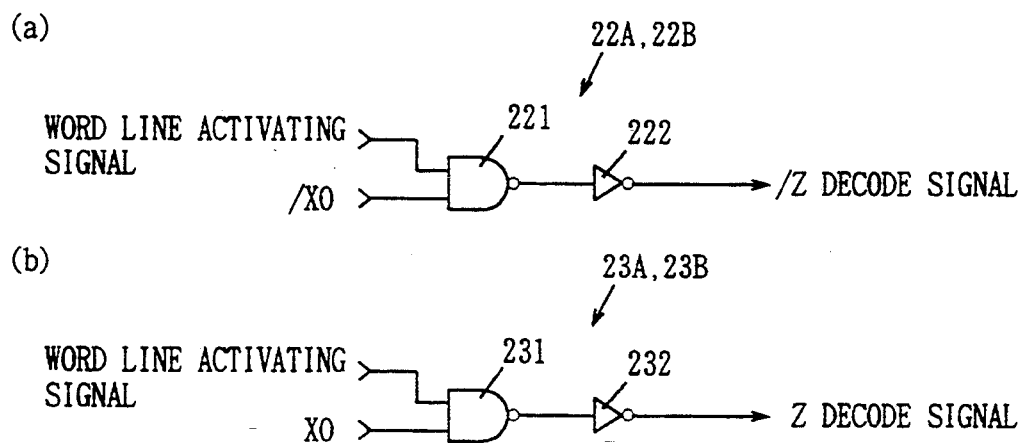
FIG. 16 is a schematic diagram of the Z decoder and the /Z decoder shown in FIG. 10A.

FIGS. 16(A) and 16(B) schematic diagrams of the Z decoders 22A, 22B and /Z decoders 23A and 23B shown in FIG. 10A. FIG. 16 (A) is a diagram of the Z decoders 22A and 22B, and FIG. 16 (B) is a diagram of the /Z decoders 23A and 23B. Each of the Z decoders 22A and 22B includes a 2-input NAND gate 221 receiving the word line activating signal and the least significant row address signal /X0, and an inverter 220 connected to the output terminal of the NAND gate. Each of the /Z decoders 23A and 23B includes a 2-input NAND gate 231 receiving the word line activating signal and the least significant row address signal X0, and an inverter 232 connected to the output terminal of the NAND gate 231. The Z decoders 22A and 22B and the /Z decoders 23A and 23B are circuits for decoding the least significant row address X0. The row addresses other than the least significant row address X0 are decoded by the main row decoder 28.

In operation, when redundancy is not selected, the word line activating signal is always at the low level, and therefore the outputs from the Z decoders 22A and 22B and from the /Z decoders 23A and 23B are always at the low level. When redundancy is selected, the word line activating signal is a pulse signal which attains the high level when both the least significant column address signal Y0 and the ATD signal or both the signals /Y0 and the ATD signal are at the high level. The /Z decoders 22A and 22B output the word line activating signal when the least significant row address signal/X0 is also at the high level, while the Z decoders 23A and 23B output the word line activating signal when the least significant row address signal X0 is also at the high level. The word line activating signals output from the /Z decoder 22A and the Z decoder 23A are applied to the row decoder 2A, while the word line activating signals output from the Z decoder 22B and the Z decoder 23B are applied to the row decoder 2B.

Figure 17:
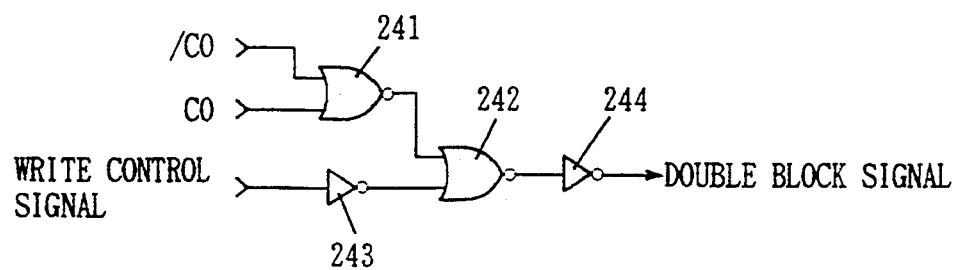
FIG. 17 is a schematic diagram of the double block selector 24 shown in FIG. 10A.

FIG. 17 is a schematic diagram of the double block selector 24 shown in FIG. 10A. In this embodiment, the redundant blocks RBA and RBB is switched basically by the least significant column address signals Y0 and /Y0. However, since there is no specific I/O in the redundant memory cell arrays 1a and 1b, only one write driver 33' is necessary to output the write data to the bit line. Namely there is no time when more than one data are simultaneously written into the same number of memory cells. Therefore, the signal for activating the write driver 33' can be provided by an OR of the block selecting signals CO and /CO.

Referring to FIG. 17, the double block selector 24 includes an NOR gate 241 receiving the block selecting signals /CO and CO, an inverter 243 inverting the write control signal, an NOR gate 242 having one input gate connected to the output terminal of the NOR gate 241 and the other input gate connected to the output terminal of the inverter 243, and an inverter 244 connected to the output terminal of the NOR gate 242.

In operation, when redundancy is not selected, the block selecting signals CO and /CO are both at the low level, and therefore the output of the NOR gate 241 receiving these signals attain the high level. The output of the NOR gate 242 receiving the output from the NOR gate 241 attains the low level, which is inverted by the inverter 242, and thus the output (double block signal) from the double block selector 24 attains the high level. When redundancy is selected one of the block selecting signals CO and /CO attains the high level, and therefore the output of the NOR gate 241 receiving these signals attains the low level. When writing is being carried out with the redundancy selected, the other input of the NOR gate 242 attains the low level, and therefore the double block signal is at the low level during writing. When reading is being carried out with redundancy selected, the other input of the NOR gate 242 is at the high level, and therefore the double block signal is at the high level. As described above, the double block signal at the low level is output when writing is done while the redundancy is selected, and otherwise the signal at the high level is output. The write driver 33' operates in response to the double block signal at the low level.

Figure 18:
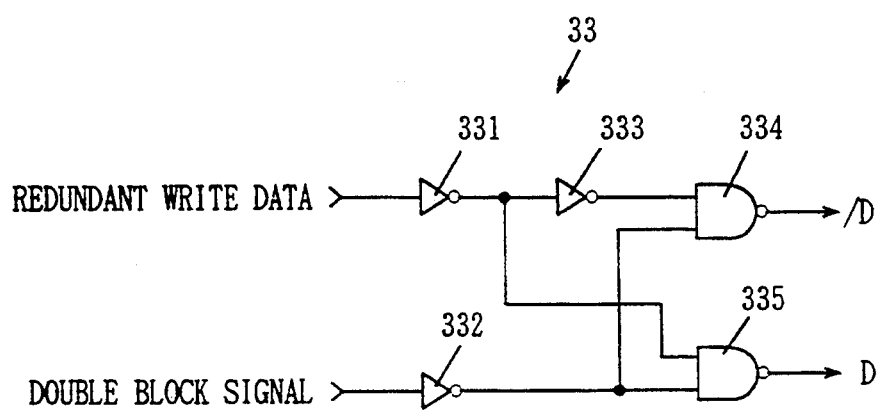
FIG. 18 is a schematic diagram of the write driver 33' shown in FIG. 10A.

FIG. 18 is a schematic diagram of the write driver 33' shown in FIG. 10A. Referring to FIG. 18, the redundant write data selected by the write data selecting circuit 27 is applied to one input terminal of the NAND gate 334 through the inverters 331 and 333. The double block signal is applied to one input terminal of the NAND gate 335 and to the other input terminal of the NAND gate 334 through the inverter 332. The redundant write data inverted by the inverter 331 is applied to the other input end of the NAND gate 335.

In operation, when redundancy is not selected, the double block signal is at the high level, and therefore the other input terminal of the NAND gate 334 and one input terminal of the NAND gate 335 are at the low level. Therefore, the output signals D and /D of the NAND gates 334 and 335 are both at the high level. When reading operation is done with redundancy selected, the double block signal is at the high level, and therefore the output signals D and /D are both at the high level, as at the time when redundancy is not selected. When writing is done with redundancy being selected, the double block signal is at the low level, and therefore the output signal /D of the NAND gate 334 is determined by the redundant write data and the output signal D of the NAND gate 335 is determined by the level of the signal provided by inverting the redundant write data. More specifically, when the redundant write data is at the high level, the input of the NAND gate 335 attains the low level and the input of the NAND gate 334 attains the high level. Therefore the output signal D attains the high level and the output signals /D attains the low level. Similarly, when the redundant write data is at the low level, the output signal D attains the low level and the output signal /D attains the high level.

As described above, the output signals D and /D of the write driver 33' are "high level"/"low level" or "low level"/"high level" when writing is done with the redundancy being selected in accordance with the level of the redundant write data, and otherwise the output signals are at the "high level"/"high level".

Figure 19:
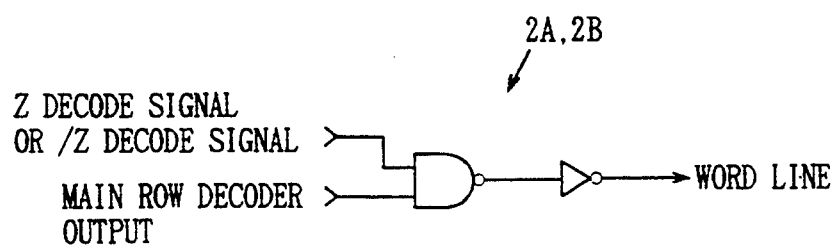
FIG. 19 is a schematic diagram of the row decoder shown in FIG. 10A.

FIG. 19 is a schematic diagram of the row decoders 2A and 2B shown in FIG. 10A. Since the row decoders 2A and 2B have the same structure, only one circuit is shown in FIG. 19. Each of the row decoders 2A and 2B outputs an AND of the output from the Z decoder or /Z decoder and the output from the main row decoder 28. The main row decoder 28 selects one word line by the address other than the least significant row address signal X0 and outputs a high level. The output from the Z decoder and /Z decoder are AND or logical product of the least significant row address signal X0 and the ATD signal and the block selecting signals CO, /CO. When the redundancy is not selected, the outputs from the Z decoder and /Z decoder are both at the low level, and therefore the word line is kept at the low level. When the redundancy is selected, one of the outputs from the Z decoder and /Z decoder is at the high level only during the ATD period (while the ATD signal is at the high level). Accordingly, only the word line which corresponds to the row address in which the least significant row address signal /X0 or X0 is at the high level and the output of the main row decoder 28 is at the high level attain to the high level. Namely, that row address is selected in the ATD period.

Figure 20:
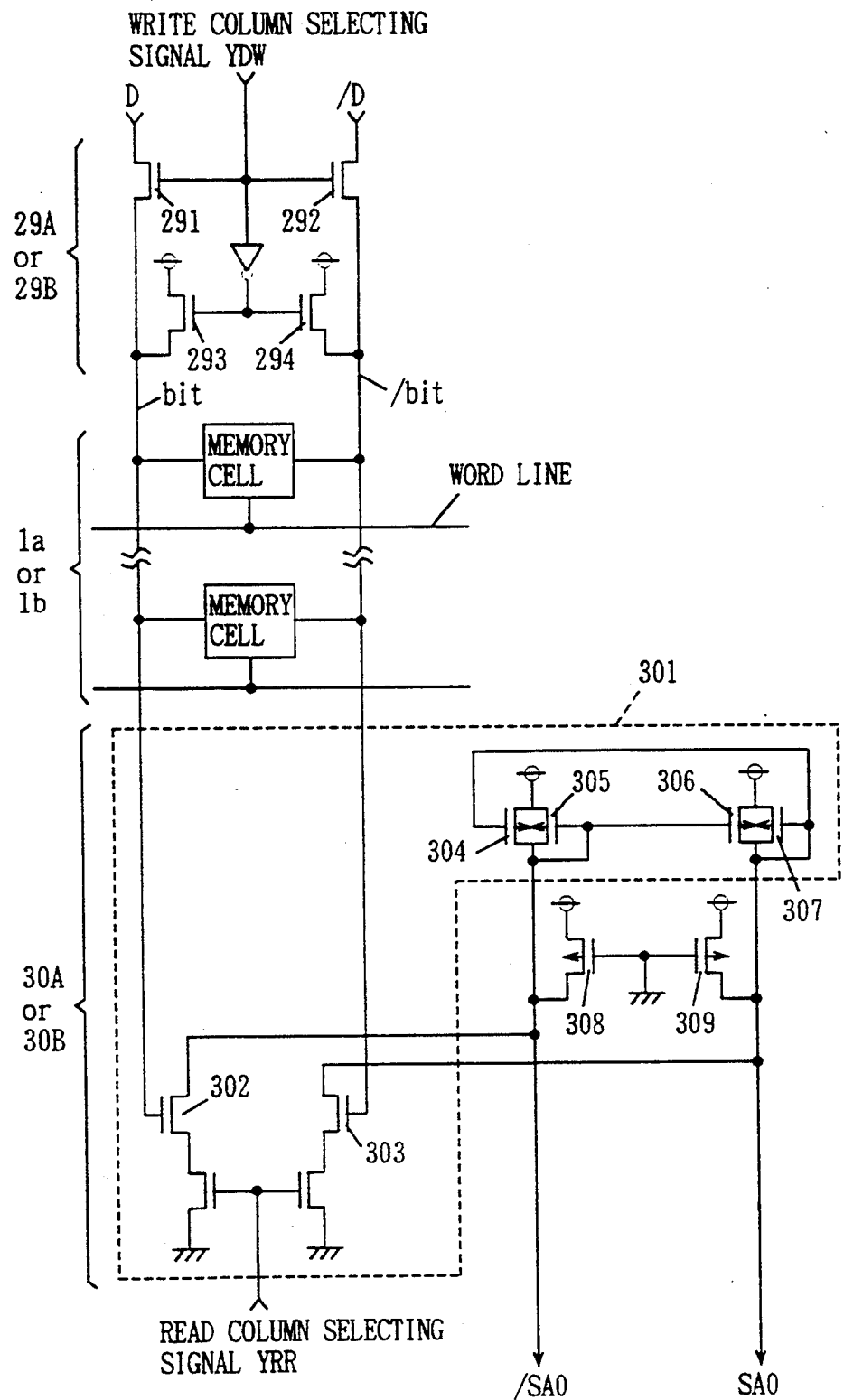
FIG. 20 is a schematic diagram showing circuit portions from the column decoder to the first stage sense amplifier shown in FIG. 10A.

FIG. 20 is a schematic diagram from the column decoder 29A or 29B to the first stage sense amplifier 30A or 30B shown in FIG. 10A.

Each of the column decoders 29A and 29B includes transfer gates 291 and 292 which transmits the redundant write data to the bit line in response to the write column selecting signal YDW. Since an SRAM is employed as an example in this embodiment, the bit line load transistors 293 and 294 are also included in the column decoders 29A and 29B. However, essentially, the transfer gates 291 and 292 only formed the column decoder.

The write column selecting signal YDW attains the high level when writing is done with redundancy being selected, and otherwise it is at the low level. Therefore, when redundancy is not selected, the write column selecting signal YDW is at the low level, and the transfer gates 291 and 292 provided between the outputs D and /D and the bit lines bit and /bit of the write driver 33', respectively, are off. When writing is being carried out with redundancy being selected, the write column selecting signal YDW is at the high level, the corresponding one of the transfer gates 291 and 292 is turned on, and the output signal D or /D of the write driver 33' is transmitted to the bit line bit or /bit. When reading is done with redundancy being selected, the write column selecting signal YDW is at the low level, and therefore the transfer gates 291 and 292 are off.

The first stage sense amplifiers 30A and 30B shown in FIG. 20 will be described. Each of the first stage sense amplifiers 30A and 30B includes a plurality of CMOS current mirror type sense amplifiers 301 (hereinafter referred to as the sense amplifier 301). The sense amplifier 301 is activated by the read column selecting signal YDR. The read column selecting signal YDR is at the high level only when the ATD signal is at the high level and the reading operation is done with the redundancy being selected. Otherwise it is always at the low level. Therefore, when redundancy is not selected, the read column selecting signal YDR is at the low level, the sense amplifier 301 is not activated, and outputs /SA0 and SA0 of the sense amplifier is fixed at the high level. When redundancy is selected and reading is being carried out, the read column selecting signal YDR is at the high level, while the ATD signal is at the high level, and therefore the corresponding sense amplifiers 301 is activated, and differentially amplified redundant memory cell data is output to the sense amplifier outputs /SA0 and SA0.

Details of the sense amplifiers 301 will be described. The sense amplifier 301 includes an nMOS transistor 302 whose gate is connected to the bit line bit, an nMOS transistor 303 whose gate is connected to the bit line /bit, a pMOS transistor 304 having its source connected to Vcc, its gate connected to the sense amplifier output SA0 and its drain connected to the sense amplifier output /SA0, a pMOS transistor 305 having its source connected to the Vcc and its gate and the drain commonly connected to the sense amplifier output /SA0, a pMOS transistor 306 having its source connected to Vcc, its gate connected to the sense amplifier output /SA0 and its drain connected to the sense amplifier output SA0, and a pMOS transistor 307 having its source connected Vcc and its gate and drain connected commonly to the sense amplifier output SA0. The pMOS transistors 308 and 309 having their gates connected to the ground potentials are load transistors of the size not affecting the amplifying operation, and therefore they are not included in the sense amplifier.

In operation, when the word line attains to the high level and the data is read to the bit lines bit and /bit and the read column selecting signal YDR attains the high level, the sense amplifier 301 corresponding to the read column selecting signal YDR starts amplification. As for the amplification, first, let us consider the circuit portion consisted of the nMOS transistors 302 and 303 and the pMOS transistors 305 and 306. The sense amplifier output /SA0 is determined by the inverter formed by the nMOS transistor 302 and the pMOS transistor 305. The sense amplifier output /SA0 is also input to the gate of the pMOS transistor 306 to determine the characteristics of the pMOS transistor 306. As a result, the gate voltage of the pMOS transistor 306 is adjusted such that the threshold value of the inverter including the nMOS transistor 303 and the pMOS transistor 306 is at the bit line potential. When there is a difference generated between the potentials of the bit lines /bit and bit, the difference is amplified and the resulting voltage appears at the sense amplifier output SA0. The similar operation is carried out in the circuit portion formed by the nMOS transistors 302 and 303 and the pMOS transistors 304 and 307. Therefore, the data written to the memory cell can be amplified in symmetry by the circuit portion including the nMOS transistors 302 and 303 and the pMOS transistors 305 and 306 and the circuit portion including the nMOS transistors 302 and 303 and the pMOS transistors 304 and 307, and therefore symmetrical data can be output to the sense amplifier output SA0 and the sense amplifier output SA0.

Figure 21:
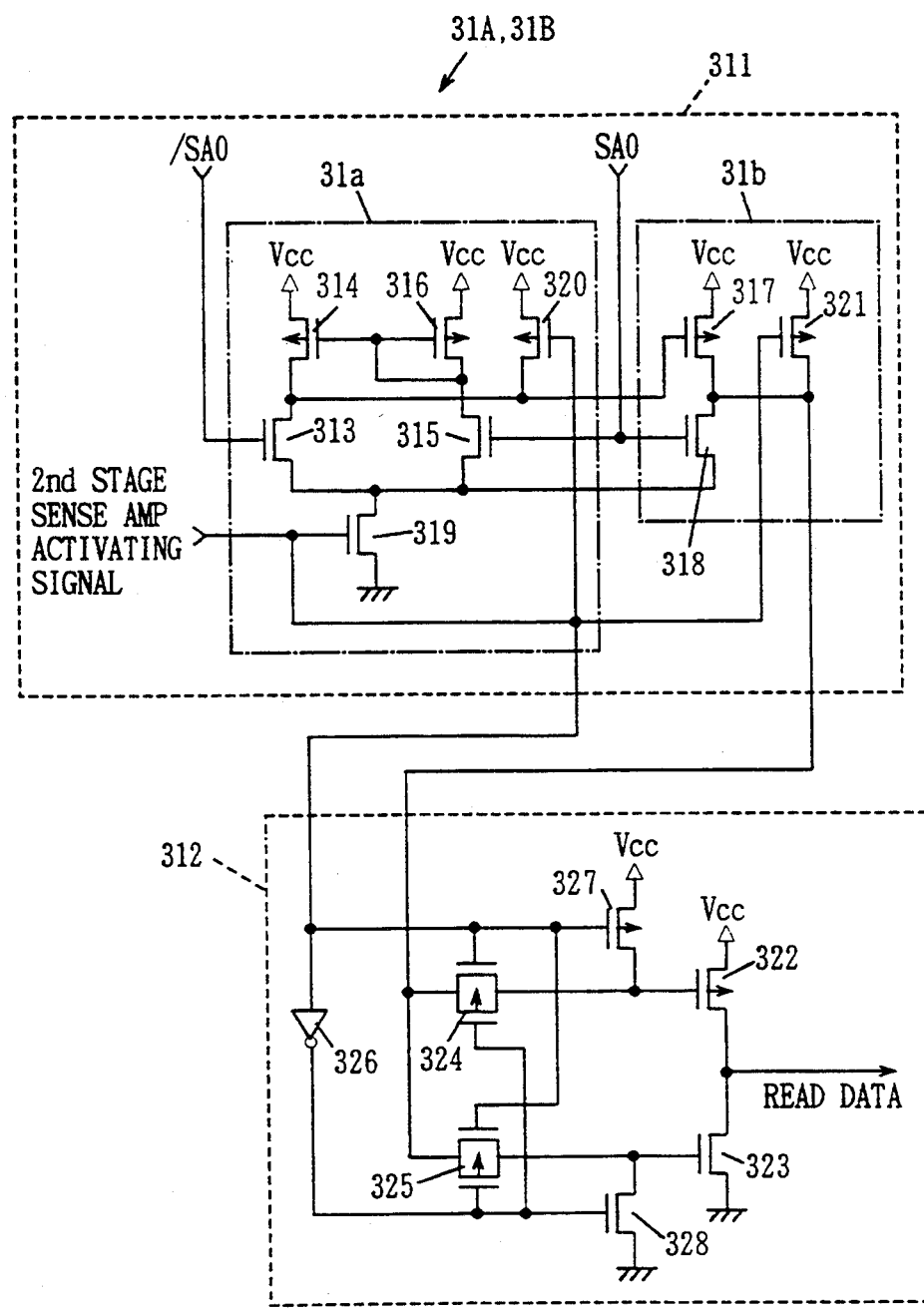
FIG. 21 is a schematic diagram of the second stage sense amplifier shown in FIG. 10A.

FIG. 21 is a schematic diagram of the second stage sense amplifiers 31A and 31B shown in FIG. 10A. Since the second stage sense amplifiers 31A and 31B have the same structure, only one circuit is shown in FIG. 21. Referring to FIG. 21, each of the second stage sense amplifiers 31A and 31B includes a potential difference detecting circuit 311 for detecting the potential difference between the output /SA0 and SA0 of the first stage sense amplifier, and a buffer circuit 312 for connecting the output of the potential difference detecting circuit 311 to a data bus. The potential difference detecting circuit 311 includes a differential amplifying stage 31a responsive to an activating signal from the corresponding one of the second stage sense amplifier activating circuits 32A and 32B for amplifying the potential difference between the sense amplifier outputs /SA0 and SA0, and an inverter 31b for inverting and amplifying the output from the difference amplifying stage 31A. The differential amplifying stage 31a includes nMOS transistors 313, 315 and 319 and pMOS transistors 314, 316 and 320. The nMOS transistor 313 has its gate connected to the sense amplifier output /SA0, its drain electrode connected to the drains of the pMOS transistors 314 and 320, and its source connected to the source of the nMOS transistor 315 and to the drain of the nMOS transistors 319. The pMOS transistor 314 has its source connected to the Vcc, its gate connected to the gate and the drain of the pMOS transistor 316. The nMOS transistor 315 has its drain connected to the drain of the pMOS transistor 316 and its gate connected to the sense amplifier output SA0. The pMOS transistor 316 has its source connected to Vcc. The pMOS transistor 320 has its source connected to Vcc and its gate connected to receive the second stage sense amplifier activating signal. The inverter 31b includes pMOS transistors 317 and 321 and an nMOS transistor 318. The pMOS transistor 317 has its source connected to the output of the differential amplifying stage 31a, that is, the drain of the nMOS transistor 313, its source connected to Vcc, and its drain connected to the drain of the nMOS transistor 318 and to the drain of the pMOS transistor 321. The nMOS transistor 318 has its gate connected to the sense amplifier output SA0 and its source connected to the source of the nMOS transistor 313. The pMOS transistor 321 has its gate connected to the second stage sense amplifier activating signal and its source connected to Vcc and its drain connected to the buffer circuit 312.

The buffer circuit 312 includes a pMOS transistor 322 having its source connected to Vcc and its drain connected to a data bus, a nMOS transistor 323 having its source connected to GND and its drain connected to the data bus, a CMOS transfer gate 324 for connecting the output of the inverter 31b to the gate of the pMOS transistor 322, a CMOS transfer gate 325 for connecting the output of the inverter 31b to the gate of the nMOS transistor 323, an inverter 326 for inverting the second stage sense amplifier activating signal, a pMOS transistor 327 having its gate connected to receive the second stage sense amplifier activating signal, its source connected to Vcc and its drain connected to the gate of the pMOS transistor 322, and an NMOS transistor 328 having its gate connected to the output of the inverter 326, its source connected to the ground potential and its drain connected to the gate of the nMOS transistor 323.

In operation, when the second stage sense amplifier activating signal attains the high level, the differential amplifying stage 31a amplifies the potential difference between the sense amplifier outputs SA0 and /SA0 in response and applies this to the inverter 31b. Now, since the differential amplifying stage 31a is an CMOS current mirror type sense amplifier, the potential at the drain of the nMOS transistor 313 is determined by the sense amplifier output SA0, and when a level difference is generated between the sense amplifier outputs /SA0 and SA0, that difference is amplified. The amplified output is further amplified by the inverter 31b and applied to the buffer circuit 312. In the buffer circuit 312, merely the data bus is driven by the pMOS transistor 320 or by the nMOS transistor 323 in accordance with the output from the inverter 31b in reading. However, if the second stage sense amplifier activating signal is at the low level, (when the redundancy is not selected or when writing is being carried out) the pMOS transistor 327 and an nMOS transistor 328 are both turned on to turn off the pMOS transistor 322 and the nMOS transistor 323, and thus the second stage sense amplifiers 31A and 31B are cut from the data bus so as to avoid contention of data on the data bus.

Figure 22:
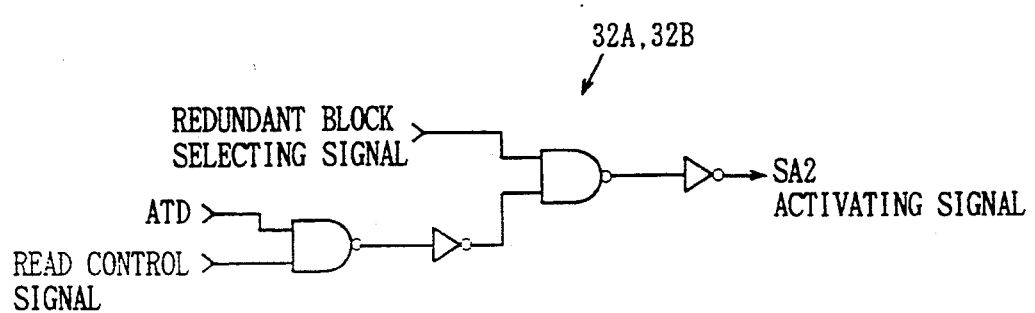
FIG. 22 is a schematic diagram of the sense amplifier activating circuit shown in FIG. 10A.

FIG. 22 is a schematic diagram of the second stage sense amplifier activating circuits 32A and 32B shown in FIG. 10A. Since the sense amplifier activating circuits 32A and 32B have the same structure, only one circuit is shown in FIG. 22. Referring to FIG. 22, the second stage sense amplifier activating circuit 32 is equivalent to a 3-input AND gate. Therefore, the second stage sense amplifier activating signal is the AND or logical product of the redundant block selecting signal, the ATD signal and the read control signal. Therefore, when redundancy is not selected, the second stage sense amplifier activating signal is at the low level. The second stage sense amplifier activating signal is also at the low level when writing is done with redundancy being selected. When reading is carried out with the redundancy being selected, the second stage sense amplifier activating signal is at the high level or the low level in accordance with the level of the ATD signal.

The operation of the semiconductor memory device shown in FIGS. 10 to 22 will be described. If redundancy is not selected, the coincidence detection signals CO1 to CO8 output from the address program circuit block 3 are at the low level, and therefore the determination signal S0 output from the redundancy selection determining circuit 6 is at the low level. Consequently, the block selecting signals CO and /CO output from the first and second redundant block selecting circuits 7a and 7b are both at the low level, the word lines are not activated and therefore data is not written to the redundant memory cell arrays 1a and 1b. Since the second stage sense amplifier activating signal selectively output from the second stage sense amplifier activating circuit 32A or 32B is always at the low level, the second stage sense amplifiers 31A and 31B are not connected to the data bus, so that false data are not read from the redundant memory cell arrays 1a and 1b.

Further, since the coincidence detection signals CO1 to CO8 are at the low level, only the input/output control signal S8 out of the input/output control signals S1 to S8 output from the I/O program circuit 4' attains the low level, and the write data selecting circuit 27 transmits the write data of I/O8 to the write driver 33' as the redundant write data. Thus penetrating current derived from unstable input potential of the write driver 33' can be prevented.

If redundancy is selected, coincidence between an externally input column address signal and a previously programmed redundant address is detected by the address program circuit block 3, and coincidence detection signals CO1 to CO8 are output. In response, the redundant selection determining circuit 6 outputs a high level determination signal S0 to the first and second redundant block selecting circuits 7a and 7b. The first redundant block selecting circuit 7a provides an AND of the input least significant column address signal /Y0 and the determination signal S0 and generates a block selecting signal /CO. The second redundant block selecting circuit 7b provides an AND of the least significant column address signal Y0 and the determination signal S0 and generates a block selecting signal CO. The block selecting signal corresponding to the selected block attains the high level. The word line activating circuit 21A generates a word line activating signal in response to the block selecting signal /CO and the ATD signal, and the word line activating circuit 21B generates a word line activating signal in response to the block selecting signal CO and the ATD signal. The generated word line activating signals are applied to the Z decoder and /Z decoder. The Z decoders 22A and 22B generate a Z decoder signal for selecting the least significant row in response to the word line activating signal and to the least significant row address signal X0. The main row decoder 28 generates a signal for selecting a row based on the row address signals except the least significant row address signal X0. The row decoders 2A and 2B provide an AND of the Z decoder signal and the signal for selecting a row from the main row decoder 28 to generate a signal for selecting only one row. By this signal, one selected word line rises to the high level, enabling writing and reading.

First, when the writing is to be done with the redundancy being selected, the Y decoder 26 for writing generates a write column selecting signal YDW in response to the coincidence detecting signals CO1 to CO8 and the write control signal WC. The write column selecting signal YWD is applied to the column decoders 29A and 29B. Consequently, writing to the column addresses of the redundant block is enabled. The write data selecting circuit 27 selects one bit of write data from the input data Di in response to the input/output control signals S1 to S8 from I/O program circuit 4'. The selected write data is transmitted to the write driver 33', and the write data is written to the memory cell at the intersection of the row and column selected by the column decoder 29A and the row decoder 2A, or at the intersection of column and row selected by the column decoder 29B and the row decoder 2B. The writing period is determined by the ATD period. By adjusting the ATD period, the operation current can be reduced.

When reading is to be carried out with the redundancy being selected, the Y decoder 25 for reading generates the read column selecting signal YDR in response to the coincidence detection signals CO1 to CO8, the ATD signal and the read control signal RC. The read column selecting signal YDR is applied to the first stage sense amplifiers 30A and 30B. Consequently, the sense amplifiers in the first stage sense amplifier 30A and 30B are selectively activated, allowing reading from a corresponding column in the memory cell arrays 1a and 1b. The data read from the redundant memory cell array 1a is amplified by the first stage sense amplifier 30A and then transmitted to the second stage sense amplifier 31A. The data read from the redundant memory cell array 1b is amplified by the first stage sense amplifier 30B and then transmitted to the second stage sense amplifier 31B. The second stage sense amplifier 31A amplifies the data applied in response to the sense amplifier activating signal from the sense amplifier activating circuit 32A to a level sufficient to drive the data bus. The second stage sense amplifiers 31B amplifies the applied data to a level sufficient to drive the data bus in response to the sense amplifier activating signal from the sense amplifier activating circuit 32B. Since only one of the second stage sense amplifiers 31A and 31B is activated, the correct data and the false data do not contend on the data bus. The reading period is also determined by the ATD signal. By adjusting the ATD period, the word line and the first and second stages of sense amplifiers are inactivated, so that the operation current after the reading period can be reduced. The replacing operation in the normal-redundant switching circuit (not shown) in which the normal data is replaced by the redundant data output from the data bus from the second stage sense amplifier is the same as that in the embodiment shown in FIG. 1.

In the semiconductor devices shown in FIGS. 1 and 10, 8 I/O are provided. However, the number of I/O may be arbitrarily selected. Although an SRAM has been described as an example of the semiconductor memory device, the present invention can be applied to a DRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cell array blocks each including memory cells arranged in rows and columns:
   at lease one redundant memory cells arranged in a plurality of rows and columns;
   address coincidence detecting means storing address signals indicating at least two adjacent columns, one at lease of which is defective, in at least one memory cell array block for detecting coincidence between an input address signal and the stored defective address signals; and
   redundant block access means responsive to said address coincidence detecting means for accessing at least two columns of said at least one redundant memory cell array block for replacing said at least two adjacent columns in said at least one memory cell array block;
   a memory cell array of said memory cell array blocks and a redundant memory cell array of said redundant memory cell array block being selected simultaneously to activate a word line of each of the selected arrays for reading data stored in said memory cell array and redundant memory cell array before replacement of said at least two adjacent columns.

2. The semiconductor memory device according to claim 1, wherein
   said redundant block access means includes
   output means having input and output data of said at least one redundant memory cell array block programmed in advance for outputting, by replacing bit by bit, a plurality of bits of said plurality of memory cell array blocks by at least two columns of said redundant memory cell array block.

3. The semiconductor memory device according to claim 2, wherein
   each of said plurality of memory cell array blocks includes a plurality of memory cell arrays for storing data;
   row decoders for selecting word lines of said plurality of memory cell arrays in response to a row address signal;
   column decoders for selecting columns of said plurality of memory cell arrays in response to a column address signal;
   a plurality of switching means provided corresponding to the columns of said plurality of memory cells and being turned on/off in response to said column decoders;
   sense amplifier means for activating data read through said plurality of switching means; and
   write driver means for transmitting an input data to said switching means.

4. The semiconductor memory device according to claim 2, wherein
   said address coincidence detecting means includes program means for programming, in advance, column address signals except the least significant column address signal of a defective column address included in said defect address signal.

5. The semiconductor memory device according to claim 4, wherein
said program means includes a fuse circuit for storing said defective column address signal.

6. A semiconductor memory device comprising:
a plurality of memory cell array blocks including memory cells arranged in rows and columns;
at least two redundant memory cell array blocks each including redundant memory cells arranged in a plurality of rows and columns, for replacing all defective columns in all blocks of said semiconductor memory device, each redundant memory cell array block having a row decoder for accessing a corresponding row in a corresponding redundant memory cell array block;
address coincidence detecting means storing address signals indicating at least two adjacent columns, one at least of which is defective, in at least one memory cell array block for detecting coincidence between an input address signal and the stored defective address signals; and
redundant block access means responsive to said address coincidence detecting means for accessing at least one column of each redundant memory cell array block for replacing said at least two adjacent columns in said at least one memory cell array block;
a memory cell array of said memory cell array blocks and a redundant memory cell array of said redundant memory cell array block being selected simultaneously to activate a word line of each of the selected arrays for reading data stored in said memory cell array and redundant memory cell array before replacement of said at least two adjacent columns.

7. The semiconductor memory device according to claim 6, wherein
each of said plurality of memory cell array blocks includes a plurality of memory cell arrays for storing data;
row decoders for selecting word lines of said plurality of memory cell arrays in response to a row address signal;
column decoders for selecting columns of said plurality of memory cell arrays in response to a column address signal;
a plurality of switching means provided corresponding to the columns of said plurality of memory cells and being turned on/off in response to said column decoders;
sense amplifier means for activating data read through said plurality of switching means; and
write driver means for transmitting an input data to said switching means.

8. A semiconductor memory device according to claim 7, wherein
said at least two redundant memory cell array blocks include:
first and second redundant memory cell arrays each including a plurality of memory cells provided in row and column directions;
first and second row decoders provided corresponding to said first and second redundant memory cell arrays for activating one word line in each of said first and second redundant memory cell arrays in response to a row address signals;
a sense amplifier for amplifying data read from said first and second redundant memory cell arrays; and
a write driver for transmitting data to be input to said first and second redundant memory cell arrays.

9. The semiconductor memory device according to claim 6, wherein
said address coincidence detecting means includes program means for programming, in advance, a defective column address included in said defect address signal.

10. The semiconductor memory device according to claim 9, wherein
said program means includes a fuse circuit for storing said defective column address signal.

11. The semiconductor memory device according to claim 6, wherein
said redundant block access means includes:
selecting means responsive to the address signal for selecting one of said at least two redundant memory cell array blocks; and
replacing means for programming in advance input/output data of said at least two redundant memory cell array blocks and in response to a coincidence detection signal from said coincidence detecting means for replacing input/output data of said plurality of memory cell array blocks by said input/output data of said selected one redundant memory cell array block in accordance with said program.

12. A semiconductor memory device, comprising:
a plurality of memory cell array blocks each including memory cells arranged in rows and columns;
at least two redundant memory cell array blocks each including redundant memory cells arranged in rows and columns;
address coincidence detecting means storing a defect address signal indicating a defective portion, if any, in said plurality of memory call array blocks for detecting coincidence between an input address signal and said stored defect address signal; and
redundant block access means responsive to said address coincidence detecting means for accessing simultaneously said at least two redundant memory cell array blocks for replacing at least two adjacent defect columns at least one of which is defective of one of said memory cell array blocks by each redundant column of said at least two redundant memory cell array blocks;
a memory cell array of said memory cell array blocks and a redundant memory cell array of said redundant memory cell array block being selected simultaneously to activate a word line of each of the selected arrays for reading data stored in said memory cell array and redundant memory cell array before replacement of said at least two adjacent defect columns.

13. The semiconductor memory device according to claim 12, wherein
each of said plurality of memory cell array blocks includes a plurality of memory cell arrays for storing data;
row decoders for selecting word lines of said plurality of memory cell arrays in response to a row address signal;
column decoders for selecting columns of said plurality of memory cell arrays in response to a column address signal;

a plurality of switching means provided corresponding to the columns of said plurality of memory cells and being turned on/off in response to said column decoders;

sense amplifier means for activating data read through said plurality of switching means; and write driver means for transmitting an input data to said switching means.

14. A semiconductor memory device according to claim 12, wherein said at least two redundant memory cell array blocks include:

first and second redundant memory cell arrays each including a plurality of memory cells provided in row and column directions;

first and second row decoders provided corresponding to said first and second redundant memory cell arrays for activating one word line in each of said first and second redundant memory cell arrays in response to a row address signals;

a sense amplifier for amplifying data read from said first and second redundant memory cell arrays; and a write driver for transmitting data to be input to said first and second redundant memory cell arrays.

15. The semiconductor memory device according to claim 12, wherein said address coincidence detecting means includes program means for programming, in advance, column address signals except the least significant column address signal of a defective column address included in said defect address signal.

16. The semiconductor memory device according to claim 15, wherein said program means includes a fuse circuit for storing said defective column address signal.

17. The semiconductor memory device according to claim 12, wherein said redundant block access means includes:

selecting means responsive to the least significant column address signal of said address signal for selecting one of said at least two redundant memory cell array blocks; and replacing means for programming in advance input/output data of said at least two redundant memory cell array blocks and in response to a coincidence detection signal from said coincidence detecting means for replacing input/output data of said plurality of memory cell array blocks by said input/output data of said selected one redundant memory cell array block in accordance with said program.

18. A semiconductor memory device, comprising:

a plurality of memory cell array blocks each including memory cells arranged in rows and columns;

at least two redundant memory cell array blocks each including redundant memory cells arranged in rows and columns;

address coincidence detecting means storing a defect address signal indicating a defective portion, if any, in said plurality of memory cell array blocks for detecting coincidence between an input address signal and said stored defect address signal; and redundant block access means responsive to said address coincidence detecting means for accessing simultaneously said at least two redundant memory cell array blocks for replacing at least two adjacent defect columns at least one of which is defective of one of said memory cell array blocks by each redundant column of said at least two redundant memory cell array blocks;

wherein said redundant block access means includes:

selecting means responsive to the least significant column address signal of said address signal for selecting one of said at least two redundant memory cell array blocks; and replacing means for programming in advance input/output data of said at least two redundant memory cell array blocks and in response to a coincidence detection signal from said coincidence detecting means for replacing input/output data of said plurality of memory cell array blocks by said input/output data of said selected one redundant memory cell array block in accordance with said program; and said selecting means includes:

determining means responsive to the coincidence detection signal from said address coincidence detecting means for determining whether or not the redundant memory cell array blocks are to be selected;

at least two selecting signal generating means provided corresponding to said at least two redundant memory cell array blocks each responsive to the result of determination by said determining means and to said least significant column address signal for generating a selecting signal for selecting either one of the redundant memory cell array blocks;

at least two first switching means provided corresponding to said at least two redundant memory cell array blocks each responsive to said address coincidence detecting means for transmitting input/output data from the corresponding one of the redundant memory cell array blocks; and at least two second switching means provided corresponding to said at least two redundant memory cell array blocks, being turned on/off in response to said generated selecting signal for transmitting said input/output data which has been transmitted to said plurality of first switching means.

19. The semiconductor memory device according to claim 17, wherein each of said first switching means includes a plurality of data transmitting means provided corresponding to a plurality of bit line pairs in the corresponding redundant memory cell array block, and simultaneously activates the data transmitting means corresponding to the coincidence detection signal, in response to the coincidence detection signal from said address coincidence detecting means.

20. The semiconductor memory device according to claim 17, wherein said replacing means includes:

decoder means for decoding the coincidence detection signal from said address coincidence detecting means for generating an input/output control signal for controlling input/output of a bit corresponding to the defect address out of a plurality of bits of data; and data switching means provided corresponding to the plurality of bits of data, responsive to the input/output control signal generated by said decoder means for switching data from said plurality of memory cell array blocks to the data of said at least two redundant memory cell array blocks.

21. A semiconductor memory device comprising:

a plurality of memory cell array blocks each including memory cells arranged in rows and columns;

first and second redundant memory cell array each including redundant memory cells arranged in rows and columns;

address coincidence detecting means storing a defect address signal indicating a defective portion, if any, in said plurality of memory cell array blocks for detecting coincidence between an input address signal and said stored defect address signal;

selecting means responsive to said address signal for selecting said first and second redundant memory cell arrays and selecting a word line in each of said redundant memory cell arrays;

write column selecting signal generating means responsive to the coincidence detection signal from said address coincidence detecting means and to an input write control signal for generating a signal for selecting a write column of each of said first and second redundant memory cell arrays;

read column signal generating means responsive to the coincidence detecting signal from said address coincidence detecting means and to an input read control signal for generating a signal for selecting a read column of each of said first and second redundant memory cell arrays;

column decoders responsive to the signal for selecting said generated write column for selecting a column in each of said first and second redundant memory cell arrays;

a sense amplifier responsive to said generated signal for selecting the read column for amplifying data output from said first and second redundant memory cell arrays and replacing means for programming in advance input/output data of said first and second redundant memory cell array and in response to a coincidence detection signal from said coincidence detecting means for replacing input/output data of said plurality of memory cell array blocks by said input/output data of said selected redundant memory cell array in accordance with said program.

22. The semiconductor memory device according to claim 21, wherein said selecting means includes:

selecting signal generating means responsive to the coincidence detection signal from said address coincidence detecting means and to the least significant column address signal of the column address signal for generating a selecting signal for selecting one of said first and second redundant memory cell arrays; and least significant row selecting means responsive to the least significant address signal of the row address and to said generated selecting signal for selecting a word line of the least significant row of said selected one of said first and second redundant memory cells.

23. The semiconductor memory device according to claim 21, wherein said sense amplifier includes two first stage sense amplifiers and two second stage sense amplifiers provided corresponding to said first and second redundant memory cell arrays, each of said first stage sense amplifiers being activated by said signal for selecting the read column, and one of said second sense amplifier being selectively activated by said selecting means.

* * * * *